US010164408B2

(12) United States Patent
Takayama

(10) Patent No.: US 10,164,408 B2
(45) Date of Patent: Dec. 25, 2018

(54) LIGHT EMITTING ELEMENT

(71) Applicant: Panasonic Intellectual Property Management Co., Ltd., Osaka (JP)

(72) Inventor: Toru Takayama, Toyama (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/832,248

(22) Filed: Dec. 5, 2017

(65) Prior Publication Data

US 2018/0109076 A1  Apr. 19, 2018

Related U.S. Application Data

(63) Continuation of application No. PCT/JP2016/002523, filed on May 25, 2016.

(30) Foreign Application Priority Data

Jun. 8, 2015  (JP) .................................. 2015-116141

(51) Int. Cl.
*H01L 27/15* (2006.01)
*H01S 5/22* (2006.01)
(Continued)

(52) U.S. Cl.
CPC .............. *H01S 5/2206* (2013.01); *H01S 5/22* (2013.01); *H01S 5/3201* (2013.01);
(Continued)

(58) Field of Classification Search
CPC . H01S 5/3406; H01S 5/2206; G03B 21/2033; H01L 21/28
See application file for complete search history.

(56) References Cited

U.S. PATENT DOCUMENTS

2006/0057824 A1  3/2006 Araki et al.
2011/0170569 A1*  7/2011 Tyagi .................... B82Y 20/00
372/45.013
2013/0100978 A1*  4/2013 Hardy .................. H01L 29/205
372/45.012

FOREIGN PATENT DOCUMENTS

JP  2002-270971 A  9/2002
JP  2003-249463 A  9/2003
(Continued)

OTHER PUBLICATIONS

International Search Report issued in Application No. PCT/JP2016/002523 dated Jul. 26, 2016, with English translation.

*Primary Examiner* — Tuan Nguyen
(74) *Attorney, Agent, or Firm* — McDermott Will & Emery LLP

(57) ABSTRACT

A light emitting element according to the present disclosure includes: a GaN substrate; a first strain correction layer disposed above the GaN substrate and including $In_xGa_{1-x}N$ of a first conductivity type where x is greater than 0 and less than or equal to 1; a first low refractive index layer disposed above the first strain correction layer, including $In_{1-a-b}Ga_aAl_bN$ of the first conductivity type, and having relationships of $(a/0.98)+(b/0.8) \geq 1$, $(a/1.02)+(b/0.85) \leq 1$, and $(a/1.03)+(b/0.68) \geq 1$; a first clad layer disposed above the first low refractive index layer, including $Al_zGa_{1-z}N$ of the first conductivity type where z is greater than or equal to 0.03 and less than or equal to 0.06, and having a refractive index higher than a refractive index of the first low refractive index layer; and an active layer disposed above the first clad layer.

18 Claims, 10 Drawing Sheets

(51) Int. Cl.
    *H01S 5/32*     (2006.01)
    *G03B 21/20*     (2006.01)
    *H01S 5/34*     (2006.01)
    *H01S 5/343*     (2006.01)
    *H01S 5/20*     (2006.01)
    *H01S 5/30*     (2006.01)

(52) U.S. Cl.
    CPC ........ *H01S 5/3211* (2013.01); *G03B 21/2033* (2013.01); *H01S 5/2009* (2013.01); *H01S 5/305* (2013.01); *H01S 5/3063* (2013.01); *H01S 5/3406* (2013.01); *H01S 5/34333* (2013.01); *H01S 2301/173* (2013.01)

(56) References Cited

FOREIGN PATENT DOCUMENTS

| | | |
|---|---|---|
| JP | 2003-282862 A | 10/2003 |
| JP | 2006-080374 A | 3/2006 |
| JP | 2006-165453 A | 6/2006 |

* cited by examiner

LIGHT EMITTING ELEMENT

CROSS REFERENCE TO RELATED APPLICATIONS

This application is a U.S. continuation application of PCT International Patent Application Number PCT/JP2016/002523 filed on May 25, 2016, claiming the benefit of priority of Japanese Patent Application Number 2015-116141 filed on Jun. 8, 2015, the entire contents of which are hereby incorporated by reference.

BACKGROUND

1. Technical Field

The present disclosure relates to high-power light sources, and in particular to a light emitting element including a nitride semiconductor.

2. Description of the Related Art

Conventionally, as one embodiment for efficiently obtaining a large-screen image, a projector is widely used as a projection image display apparatus which illuminates, with light emitted by a light source such as a lamp, a spatial light modulator element included in a compact liquid-crystal panel or the like that forms an image according to a video signal, magnifies the optical image, and projects the magnified image on a screen by a projection lens. In a projection image display apparatus such as the projector described above, a light source generally includes an extra-high pressure mercury lamp capable of obtaining high luminous efficiency in a wavelength range of visible light.

In contrast, a light emitting diode (LED) that is a semiconductor element is used instead of a high pressure mercury lamp, as the light source of the projector in recent years. An LED projector has a feature of being low in power consumption, high in quietness, and long in lamp product life. In addition, the body size of the LED projector is compact.

However, an LED uses spontaneous light emission of an active layer that is a light emitting layer, and thus does not have sufficient luminance. For that reason, a laser projector capable of obtaining sufficient luminance in a visible light range, by exciting a phosphor using a semiconductor laser element capable of performing high-power operations of a watt class (i. e., at least 1 W), in a light source, has been the focus of attention.

A semiconductor laser element (nitride semiconductor laser element) including a nitride material whose general formula is represented by $In_{1-x-y}Ga_xAl_yN$ ($0 \leq x \leq 1$, $0 \leq y \leq 1$) is capable of emitting light from visible light to ultraviolet light, and thus is suitable as a light source of the above-described laser projector.

For example, by using a nitride semiconductor laser element as a light source of blue light and green light, and a laser element including an AlGaInP material as a red light source, it is possible to implement a compact laser projector of a low power consumption.

Here, there is a demand for a semiconductor laser element used in a projector light source to perform not only a high-power operation of a watt class but also a long-term operation for 10000 hours or longer in a high-temperature operation at greater than or equal to 50 degrees Celsius.

In view of this, for example, in the conventional disclosure of Japanese Unexamined Patent Application Publication No. 2002-270971 illustrated in FIG. 11, a technique related to a nitride blue laser element having a center oscillation wavelength of 430 nm is disclosed.

According to this conventional disclosure, a ridge stripe is formed in a laminated structure including, above GaN substrate 101, $Al_{0.05}Ga_{0.95}N$ buffer layer 102, N-type contact layer 103, crack prevention layer 104, N-type clad layer 105, N-type light guide layer 106, N-side first nitride semiconductor layer 31b, multiple quantum well active layer 107, P-type electronic containment layer 108, P-side first nitride semiconductor layer 31a, P-type light guide layer 109, P-type clad layer 110, and P-type contact layer 111, thereby obtaining laser oscillation with an oscillation wavelength of 448 nm. N-type contact layer 103 includes Si doped $Al_{0.05}Ga_{0.95}N$. Crack prevention layer 104 includes $In_{0.05}Ga_{0.94}N$, and has a thickness of 0.15 μm. N-type clad layer 105 is a superlattice resulting from repeating 200 times a combination of undoped $Al_{0.05}Ga_{0.95}N$ having a thickness of 2.5 nm and an Si doped GaN having a thickness of 2.5 nm. N-type light guide layer 106 includes undoped GaN, and has a thickness of 0.1 μm. N-side first nitride semiconductor layer 31b includes Si doped $In_{0.06}Ga_{0.95}N$ having a thickness of 50 nm. Multiple quantum well active layer 107 includes three barrier layers each including undoped $In_{0.05}Ga_{0.95}N$ having a thickness of 13 nm, and two well layers each including undoped $In_{0.32}Ga_{0.68}N$ having a thickness of 2.5 nm. P-type electronic containment layer 108 includes an Mg doped $Al_{0.3}Ga_{0.7}N$ layer having a thickness of 10 nm. P-side first nitride semiconductor layer 31a includes an Mg doped $In_{0.05}Ga_{0.95}N$ layer having a thickness of 50 nm. P-type light guide layer 109 includes undoped GaN having a thickness of 0.15 μm. P-type clad layer 110 is a superlattice having a thickness of 0.45 μm and resulting from repeating 90 times a combination of undoped $Al_{0.05}Ga_{0.95}N$ having a thickness of 2.5 nm and Mg doped GaN having a thickness of 2.5 nm. P-type contact layer 111 includes an Mg doped P-type GaN layer having a thickness of 15 nm.

According to the conventional structure illustrated in FIG. 11, light confinement in a vertical direction to multiple quantum well active layer 107 is performed by N-type clad layer 105 and P-type clad layer 110, and light confinement in a horizontal direction is performed by a ridge formed in P-type clad layer 110, thereby enabling laser oscillation. It should be noted that, in the present application, the direction of normal line of a substrate is referred to as a vertical direction, and the direction parallel to an end surface of a laser resonator and perpendicular to the direction of the normal line of the substrate is referred to as a horizontal direction.

In addition, according to the conventional disclosure, the light confinement ratio of light distribution in the vertical direction to an active layer is increased by first nitride semiconductor layer 31a and P-type light guide layer 109. First nitride semiconductor layer 31a includes an Mg doped $In_{0.05}Ga_{0.95}N$ layer having a thickness of 50 nm and disposed between P-type electronic containment layer 108 and P-type clad layer 110. P-type light guide layer 109 includes undoped GaN having a thickness of 0.15 μm.

In addition, P-type electronic containment layer 108 reduces carrier overflow that is a leakage, to P-type clad layer 110, of electrons injected to the active layer.

In this structure, two InGaN well layers each of which has an In composition of 0.32 and a thickness of 2.5 nm are used in multiple quantum well active layer 107, thereby implementing a blue laser element having a wavelength of 448 nm for enhancing temperature properties and reduces a laser oscillation threshold current value.

It should be noted that, in the description below, there are cases where $Al_xGa_{1-x}N$ (0<x<1) that is a ternary mixed crystal is denoted as AlGaN, $In_yGa_{1-y}N$ (0<y<1) is denoted as InGaN, and $In_yAl_xGa_{1-x-y}N$ (0<x<1, 0<y<1) that is a quaternary mixed crystal is denoted as InAlGaN.

SUMMARY

There is a demand for a semiconductor laser element used in a projector light source to perform not only a high-power operation of a watt-class but also a long-term operation for 10000 hours or longer in a high-temperature operation at greater than or equal to 50 degrees Celsius. Accordingly, in a blue range having a center wavelength of 445 nm and a green range having a center wavelength of 530 nm, it is necessary to implement a semiconductor laser element capable of performing a high-temperature and high-power operation.

Here, with an increase in an oscillation wavelength from a blue-violet range of 405 nm to a blue range of 530 nm, the refractive index difference between the InGaN layer broadly used in the active layer and the AlGaN layer broadly used in the clad layer is decreased. For that reason, a nitride laser element in which an AlGaN material is used in the clad layer has a following problem: light confinement in a vertical direction in a nitride laser element of an oscillation wavelength range having a long wavelength, such as a blue laser element having a center oscillation wavelength of 445 nm and a green laser element having a further longer center oscillation wavelength of 530 nm, is decreased compared to a blue-violet laser element having a center wavelength of 405 nm.

In order to solve the above-described problem, the Al composition of the AlGaN layer used in the clad layer may be set to 0.1 or higher. However, in this case, a difference in a coefficient of thermal expansion increases between the AlGaN layer and the InGaN layer used in the active layer, leading to cracking or lattice defects.

The present disclosure has been conceived to solve the above-described problems, and one non-limiting and explanatory embodiment provides a laser element having a center wavelength of 445 nm, capable of suppressing a decrease in ΔN and a decrease in a light confinement coefficient, with a structure in which an InGaN buffer layer is used for suppressing occurrence of cracking.

In order to solve the above-described problems, a light emitting element according to the present disclosure includes: a GaN substrate; a first strain correction layer disposed above the GaN substrate and including $In_xGa_{1-x}N$ (0.01×0.03) of a first conductivity type where x is greater than 0 and less than or equal to 1; a first low refractive index layer disposed above the first strain correction layer, including $In_{1-a-b}Ga_aAl_bN$ of the first conductivity type, and having relationships of (a/0.98)+(b/0.8)≥1, (a/1.02)+(b/0.85)≤1, and (a/1.03)+(b/0.68)≥1; a first clad layer disposed above the first low refractive index layer, including $Al_zGa_{1-z}N$ of the first conductivity type where z is greater than or equal to 0.03 and less than or equal to 0.06, and having a refractive index higher than a refractive index of the first low refractive index layer; and an active layer disposed above the first clad layer.

According to the above-described configuration, since the relationships of (a/0.98)+(b/0.8)≥1, (a/1.02)+(b/0.85)≤1, and (a/1.03)+(b/0.68)≥1 are satisfied, it is possible to cause the first low refractive index layer including $In_{1-a-b}Ga_aAl_bN$ of the first conductivity type to have a lower refractive index than AlGaN having an Al composition of 0.06, and it is also possible to cause a difference in a lattice constant between the first low refractive index layer and GaN to be less than a difference in a lattice constant between AlGaN having an Al composition of 0.1 and GaN. Moreover, by setting the range of Al composition z of the first clad layer including $Al_zGa_{1-z}N$ of the first conductivity type to 0.03≤z≤0.06, it is possible to cause a refractive index of the first low refractive index layer to be lower than a refractive index of the first clad layer. As a result, the light distribution in the vertical direction attenuates in the first low refractive index layer which is low in the refractive index, and thus is less subjected to the effects of the first strain correction layer which is high in the refractive index. Accordingly, it is possible to suppress the decrease in ΔN. In addition, the first low refractive index layer suppresses extending, toward the GaN substrate, of the light distribution in the vertical direction. Accordingly, it is possible to prevent the light confinement coefficient from decreasing.

The light emitting element according to the present disclosure may further include a second clad layer disposed above the active layer, including $Al_tGa_{1-t}N$ of a second conductivity type where t is greater than or equal to 0 and less than or equal to 1, and including a ridge protruding in a direction from the GaN substrate toward the active layer.

In addition, in the light emitting element according to the present disclosure, x in an In composition of the first strain correction layer may be higher than or equal to 0.01 and lower than or equal to 0.03. According to the above-exemplified configuration, it is possible to compensate tensile strain that is generated in the first clad layer and the second clad layer which are grown in crystal above the first strain correction layer in which compressive strain is generated, and thus the magnitude of an average strain in the entire double heterostructure formed on the GaN substrate is reduced. Accordingly, it is possible to suppress occurrence of cracking.

As a result, it is possible to suppress a decrease in ΔN and a decrease in the light confinement coefficient, while suppressing occurrence of cracking.

In addition, in the light emitting element according to the present disclosure, the first strain correction layer may have a thickness greater than or equal to 0.1 μm and less than or equal to 0.2 μm. According to the above-exemplified configuration, it is possible to suppress occurrence of lattice defects in the first strain correction layer, compensate tensile stress generated in the first clad layer and the second clad layer, and suppress occurrence of cracking.

In addition, in the light emitting element according to the present disclosure, the first low refractive index layer may include $Al_bGa_{1-b}N$ of the first conductivity type where b is greater than or equal to 0.06 and less than or equal to 0.1.

In addition, in the light emitting element according to the present disclosure, the first low refractive index layer may have a thickness greater than or equal to 10 nm and less than or equal to 100 nm. According to the above-exemplified configuration, it is possible to prevent an increase in an operation voltage of the light emitting element and suppress a decrease in ΔN and a decrease in a light confinement coefficient, by setting the thickness of the first low refractive index layer to at least 10 nm and at most 100 nm.

In addition, in the light emitting element according to the present disclosure, the first low refractive index layer may have a single quantum well structure or may be a multiple quantum well, and may have an average atomic composition of $In_{1-a-b}Ga_aAl_bN$.

According to the above-exemplified configuration, the thickness of each of the layers included in a multiple quantum well low refractive index layer is less than or equal to a critical layer thickness, making it possible to suppress occurrence of lattice defects in the first low refractive index layer. As a result, reliability in long-term operation of the light-emitting element improves.

In addition, in the light emitting element according to the present disclosure, in the first clad layer, z may be less than or equal to 0.04.

In addition, in the light emitting element according to the present disclosure, the first clad layer may have a thickness less than or equal to 1 μm, and z may be greater than or equal to 0.03 and less than or equal to 0.04. According to the above-exemplified configuration, it is possible to cause the average strain of the entire layer to be compressive strain. In this case, overflow of carriers injected to the active layer is suppressed, and thus high-temperature operation properties of the light emitting element are improved, and the operation current value is decreased. As a result, reliability in long-term operation of the light emitting element improves.

In addition, the light emitting element according to the present disclosure may further include a second strain correction layer disposed between the GaN substrate and the first strain correction layer, and including $Al_sGa_{1-s}N$ of the first conductivity type where s is greater than 0 and less than or equal to 0.01. According to the above-exemplified configuration; that is, according to the configuration in which the Al composition of the second strain correction layer including $Al_sGa_{1-s}N$ is less than or equal to 0.01, it is possible to set the critical thickness of the second strain correction layer to be greater than or equal to 300 nm, making it possible to suppress occurrence of lattice defects due to lattice mismatching with the GaN substrate.

In addition, in the light emitting element according to the present disclosure may further include an intermediate layer disposed between the second strain correction layer and the first strain correction layer, and including GaN of the first conductivity type. According to the above-exemplified configuration, it is possible to recover crystallinity by including an intermediate layer including GaN on the second strain correction layer. By forming the first strain correction layer on the intermediate layer, it is possible to compensate strain by the second strain correction layer in which tensile strain occurs and the first strain correction layer in which compressive strain occurs, even when the first strain correction layer is formed. Thus, it is possible to suppress occurrence of lattice defects in the interface between the intermediate layer and the first strain correction layer. As a result, it is possible to prevent deterioration of reliability in the long-term operation of the light emitting element.

In addition, in the light emitting element according to the present disclosure may further include an electron barrier layer disposed between the active layer and the second clad layer, and including $Al_hGa_{1-h}N$ of the second conductivity type where h is greater than 0 and less than or equal to 1.

In the light emitting element according to the present disclosure, further, the electron barrier layer may have compressive strain.

In the light emitting element according to the present disclosure, further, the second clad layer may have compressive strain.

In addition, in the light emitting element according to the present disclosure, the active layer may be a quantum well including at least one of: a well layer including $In_fGa_{1-f}N$ where f is greater than 0 and less than or equal to 1; and a barrier layer including $Al_gGa_{1-g}N$ where g is greater than or equal to 0 and less than or equal to 1.

In addition, in the light emitting element according to the present disclosure, the active layer may be a multiple quantum well including at least two well layers each being the well layer.

In addition, in the light emitting element according to the present disclosure, further, the active layer may be one of a double quantum well and a triple quantum well.

In addition, in the light emitting element according to the present disclosure, further, the active layer may have a characteristic wavelength greater than or equal to 445 nm.

With the light emitting element according to the present disclosure, in a laser element of a long wavelength having a center wavelength of 445 nm or longer, it is possible to suppress a decrease in ΔN and a decrease in a light confinement coefficient, in a structure in which an InGaN buffer layer is used for suppressing occurrence of cracking.

As a result, it is possible to implement a watt-class nitride laser element which is in a watt-class and has a long wavelength range having an emission center wavelength of 445 nm or longer, and excels in a long-term reliable operation and in temperature properties in a high-temperature operation.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

Figure 1:
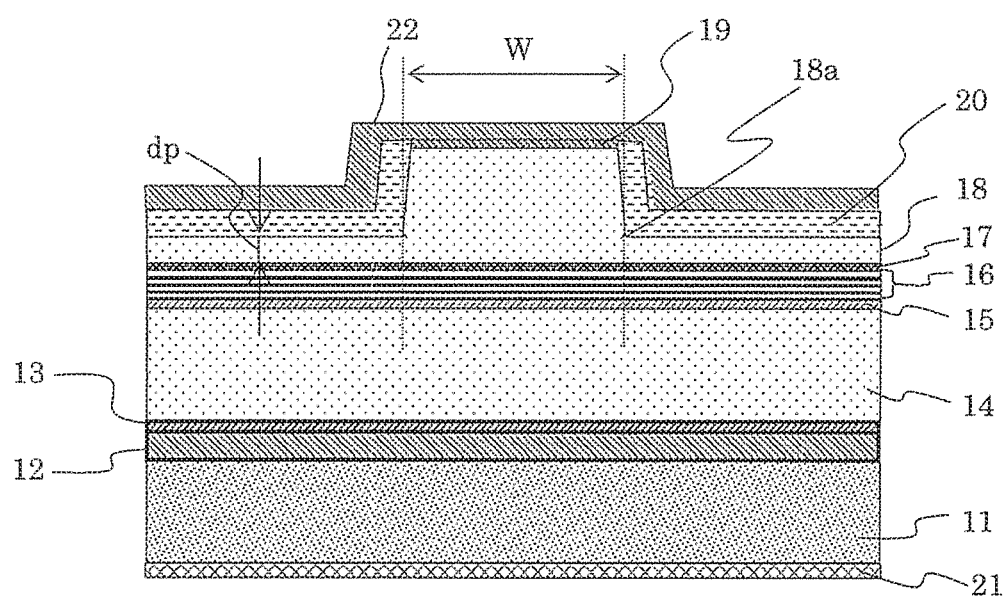
FIG. 1 is a cross sectional view which illustrates a layer structure of the light emitting element according to Embodiment 1 of the present disclosure.

DETAILED DESCRIPTION OF THE EMBODIMENTS (Underlying Knowledge Forming the Basis of the Present Disclosure)

The inventors found that the following problems occur in relation to the light emitting element described in the "Background Art" section.

There is a demand for a semiconductor laser element used in a projector light source to perform not only a high-power operation of a watt-class but also a long-term operation for 10000 hours or longer in a high-temperature operation at greater than or equal to 50 degrees Celsius. Accordingly, it is necessary to implement a semiconductor laser element capable of performing a high-temperature and high-power operation in a blue range having a center wavelength of 445 nm and a green range having a center wavelength of 530 nm.

Here, with an increase in an oscillation wavelength from a blue-violet range of 405 nm to a blue range of 530 nm, the refractive index difference between the InGaN layer broadly used in the active layer and the AlGaN layer broadly used in the clad layer is decreased. For that reason, a nitride laser element in which an AlGaN material is used in the clad layer has a following problem: light confinement in the vertical direction in the nitride laser element of an oscillation wavelength range having a long wavelength, such as a blue laser element having a center oscillation wavelength of 445 nm and a green laser element having a further longer center oscillation wavelength of 530 nm, is decreased compared to a blue-violet laser element having a center wavelength of 405 nm.

In order to solve the above-described problem, the Al composition of the AlGaN layer used in the clad layer may be set to 0.1 or higher. However, in this case, a difference in a coefficient of thermal expansion increases between the AlGaN layer and the InGaN layer used in the active layer, leading to cracking or lattice defects. In addition, resistance increases in the P-type AlGaN clad layer, leading to an increase in an operation voltage of an element. For that reason, in order to suppress occurrence of cracking, it is difficult to set the Al composition to approximately 0.1 or higher when the AlGaN layer is used in the clad layer. In addition, even when the AlGaN layer having the Al composition between 0.05 and 0.1 is used, the resistance in the P-type AlGaN layer is likely to increase, leading to an increase in the operation voltage. An increase in the operation voltage causes an increase in a self-generated heat in an element when the element oscillates laser, and thus the temperature properties are deteriorated.

In addition, although the In composition of the InGaN well layer of the quantum well active layer is approximately 0.07 in order to obtain an intended oscillation wavelength for a blue-violet laser element having a center wavelength of 405 nm, the In composition of the InGaN well layer needs to be approximately 0.15 or higher for a blue laser element having a center oscillation wavelength of 445 nm. Furthermore, for a green laser element having a center oscillation wavelength of 530 nm, an InGaN layer with a high In composition in which the In composition of the InGaN well layer is approximately 0.3 or higher is required. When the In composition increases in the InGaN layer, not only the lattice mismatching with the GaN substrate increases, but also an internal strain energy accumulated in a crystal increases due to the difference in a stable distance between a group III atom and a group V atom between InN and GaN included in the InGaN layer. In order to reduce the internal strain energy, compositional separation is likely to occur, in which a composition separates between a region with a high In composition and a region with a low In composition, in the InGaN layer having a high In composition. The temperature around 800 degrees Celsius that is a temperature for the growth of the InGaN layer generates an unstable state thermodynamically when the In composition is high being around 0.15 or higher, and thus compositional separation is likely to occur. When the compositional separation occurs, an in-plane distribution of the band gap energy varies in the well layer. In a portion having a small band gap wavelength, the In composition is high, and thus not only lattice defects are likely to occur, but also the portion becomes a center of light absorption for laser oscillation light, leading to a decrease in an external differential efficiency (hereinafter referred to as a slope efficiency) in an oscillation threshold current value and current-optical output properties. As a result, the operation current value increases and the temperature properties are deteriorated, leading to a practically serious damage.

In view of the above, in order to suppress the occurrence of lattice defects due to compositional separation or lattice mismatching, it is effective that a volume of the InGaN well layer is reduced by setting the thickness of a well layer having a high In composition to less than or equal to 3 nm, and a GaN layer or an InGaN layer having an In composition of approximately 0.05 or lower, being less lattice mismatching with GaN, is caused to grow by approximately 10 nm or greater as a barrier layer which grows above the InGaN well layer, for the recovery of the crystallinity. With the structure described above, the thin well layer is vertically sandwiched between GaN layers or InGaN layers whose lattice constant is close to a lattice constant of the GaN layer, and thus it is possible to suppress to a certain degree the compositional separation of the InGaN well layer without exceeding the critical thickness at which lattice defects occur in the InGaN layer. This is because a layer is thermodynamically stable when compositional separation does not occur, even when the layer has a high In composition, due to the strain energy caused by lattice mismatching between a well layer and a barrier layer that occurs at the interface between the barrier layer and the well layer. As described above, the InGaN well layer having a high In composition needs to be thin with a thickness of approximately 3 nm or less.

In this case, since the well layer is thin, the light confinement coefficient to the active layer further decreases. Accordingly, in order to increase the light confinement coefficient, the Al composition of the AlGaN layer used in the clad layer may be set to 0.1 or as greater as possible, as described above. However, in this case, a difference in a lattice constant increases between the AlGaN layer and the InGaN layer used in the active layer, leading to cracking or lattice defects.

As described above, in the nitride laser element having a center wavelength from 445 nm to 530 nm, it is difficult to increase a refractive index difference between the InGaN active layer and the AlGaN clad layer, and the well layer needs to be thin with a thickness being 3 nm or less. Accordingly, the light confinement coefficient in the vertical direction is significantly small; that is, approximately 1%. When the light confinement coefficient is small, the operation carrier density increases in the active layer, and the carrier overflow from the active layer to the P-type clad layer increases in a high-temperature and high-power operation, leading to deterioration of the temperature properties, or a decrease in a thermal saturation level of an optical output in the current-optical output properties.

When the Al composition of the AlGaN clad layer is set high so as to increase the light confinement coefficient, cracking or lattice defects are likely to occur, leading to a serious damage to the long-term operation reliability of the element.

Here, in the present disclosure, the direction of a normal line of a substrate is referred to as a vertical direction, and the direction perpendicular to the direction of the normal line of the substrate is referred to as a horizontal direction, in an end face of a resonator.

Figure 12:
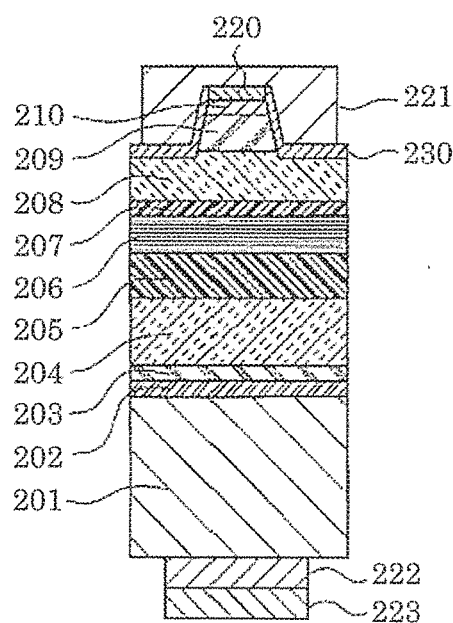
FIG. 12 is a cross sectional view which illustrates a layer structure of a second conventional light emitting element.

In order to prevent cracking, according to a conventional structure described in Japanese Unexamined Patent Application Publication No. 2006-165453 (second conventional technique), free standing substrate 201 including GaN, first buffer layer 202 which is formed above the substrate and includes N-type $Al_xGa_{1-x}N$ ($0 \leq x \leq 0.1$), and second buffer layer 203 which is formed above the first buffer layer and includes N-type $In_yGa_{1-y}N$ ($0 < y \leq 0.1$) are formed, and N-side clad layer 204, active layer 206, and P-type clad layer 209 are sequentially formed above the second buffer layer as illustrated in FIG. 12. It is disclosed, according to the above described structure, the function of the buffer layer is divided between first buffer layer 202 which suppresses occurrence of transposition from a regrowth interface and second buffer layer 203 which suppresses occurrence of cracking, thereby causing a high-quality AlGaN layer to grow above free standing substrate 201 and obtaining a nitride semiconductor element which excels in electrical characteristics.

However, with this structure, second buffer layer 202 has a relatively high refractive index compared to the other layers. Accordingly, when a layer between second buffer layer 202 and active layer 206 is thin, the light distribution confined in a waveguide is affected by second buffer layer 202 having a high refractive index, and the light distribution in the vertical direction deviates toward the substrate side where second buffer layer 202 is located.

This causes a decrease in an effective refractive index difference ($\Delta N$) inside and outside the ridge, and a confinement mechanism of the light distribution in the horizontal direction is weakened. As a result, a problem occurs such as occurrence of kink in which current-optical output properties are non-linear or an increase in an operation current value. In this case, in order to prevent the light distribution in the vertical direction from extending to second buffer layer 202, the light confinement in the vertical direction may be strengthened by increasing the thickness of N-side clad layer 204 between second buffer layer 202 and active layer 206, or increasing the Al composition of N-side clad layer 204 between the substrate and the active layer. However, this increases a stress in N-side clad layer 204, and thus cracking is likely to occur. Alternatively, a method of causing the light distribution in the vertical direction to be relatively closer to the light distribution in the vertical direction of a P-type layer than the light distribution in the vertical direction of an N-type layer, by setting the Al composition of P-side clad layer 209 to be lower than the Al composition of N-side clad layer 204 and increasing the refractive index of P-side clad layer 209 to be relatively greater than the refractive index of N-side clad layer 204. However, this decreases the light confinement coefficient in active layer 206, and thus the temperature properties are deteriorated.

For that reason, with a conventional laser element having a center wavelength of 445 nm in which the InGaN buffer layer is used, when the thickness of the N-side clad layer is decreased to suppress cracking in the N-side clad layer, $\Delta N$ decreases and the light confinement coefficient decreases, and thus it has been difficult to implement a laser element which has excellent linear current-optical output properties and also excels in the temperature properties.

The present disclosure has been conceived to solve the above-described problems, and one non-limiting and explanatory embodiment provides a laser element having a center wavelength of 445 nm, capable of suppressing a decrease in $\Delta N$ and a decrease in a light confinement coefficient, with a structure in which an InGaN buffer layer is used for suppressing occurrence of cracking.

Hereinafter, embodiments of the present disclosure shall be described with reference to the drawings.

Embodiment 1

(1-1 Element Structure)

FIG. 1 illustrates a cross sectional view related to a structure of the light emitting element according to Embodiment 1 of the present disclosure. The light emitting element illustrated in FIG. 1 includes: above GaN substrate 11 with c-surface ((0001) surface) being a main surface, first strain correction layer 12 which includes N-type InGaN and has a thickness of 0.1 μm, first low refractive index layer 13 which includes N-type AlGaN and has a thickness of 0.05 μm, first clad layer 14 which includes N-type AlGaN, light guide layer 15 which includes N-type GaN and has a thickness of 0.2 μm, active layer 16 which includes an InGaN material and is a multiple quantum well, electron barrier layer 17 whose Al composition is 0.2 and which includes P-type AlGaN and has a thickness of 20 nm, second clad layer 18 which includes P-type AlGaN, contact layer 19 which includes P-type GaN and has a thickness of 0.1 μm, current block layer 20 which includes $SiO_2$ which is transparent with respect to emission light, P-side electrode 22, and N-side electrode 21. The light emitting element is a semiconductor laser element. Ridge 18a is defined on second clad layer 18. Ridge 18a has a base with a width (W) of 8.0 μm. In addition, the width of ridge 18a decreases with increasing distance from GaN substrate 11. It should be noted that P-side electrode 22 has a laminated structure including Ni, Pt, and Au, and N-side electrode 21 has a laminated structure including Ti and Al.

In second clad layer 18, the distance between an upper end of ridge 18a and active layer 16 is 0.7 μm, and the distance between a lower end of ridge 18a and active layer 16 is dp (0.05 μm). It should be noted that Si is used as N-type dopant, and Si of approximately $10^{18}$ $cm^{-3}$ is added to the N-type semiconductor layer. In addition, Mg is used as P-type dopant, and Mg of approximately $10^{19}$ $cm^{-3}$ is added to the P-type semiconductor layer.

Electron barrier layer 17 is provided so as to suppress overflow (carrier overflow) of electrons confined in active layer 16 to second clad layer 18.

The light emitting element according to Embodiment 1 of the present disclosure is a ridge-stripe semiconductor laser element. Ridge 18a extends along a direction perpendicular to a paper surface of FIG. 1, and has a length of 1000 µm. In addition, low-reflectivity (AR) coating is applied to a front end surface (not illustrated) of the light emitting element, and high-reflectivity (HR) coating is applied to a rear end surface (not illustrated) of the light emitting element. The front end surface and the rear end surface are both perpendicular to the direction along which ridge 18a extends, and a resonator is formed between the front end surface and the rear end surface.

The emission wavelength of the light emitting element according to Embodiment 1 of the present disclosure is 445 nm.

(1-2 Study on Al Composition of First Clad Layer 14 and Second Clad Layer 18)

Here, it is possible to increase the refractive index difference between active layer 16 and first clad layer 14 and the refractive index difference between active layer 16 and second clad layer 18, by increasing the Al composition of first clad layer 14 and the Al composition of second clad layer 18, enabling strongly confining light in a direction perpendicular to active layer 16. Accordingly, it is possible to decrease an oscillation threshold current value. However, when the Al composition of first clad layer 14 and second clad layer 18 is increased too much, lattice defects occur due to the difference in lattice constants between AlGaN and GaN, leading to a decrease in reliability. Furthermore, when the Al composition is increased, resistance of second clad layer 18 increases due to a decrease in an activation rate of a P-type impurity, leading to an increase in resistance in series of the light emitting element. For that reason, the upper limit of the Al composition of each of first clad layer 14 and second clad layer 18 is equal to or lower than 0.1, and more preferably is equal to or lower than 0.05.

In contrast, in a long wavelength range having a center wavelength of 445 nm or longer, the refractive index between active layer 16 and the AlGaN material decreases, and the light confinement coefficient in the vertical direction decreases. For that reason, it is necessary to increase the light confinement coefficient in the vertical direction by increasing as much as possible the Al composition of first clad layer 14 and second clad layer 18. In particular, increasing of the refractive index of the InGaN layer and the AlGaN layer is more difficult in the long wavelength range having a center wavelength of 445 nm or longer, than in a wavelength range having a center wavelength of 405 nm. Accordingly, it is difficult to increase the light confinement coefficient in the vertical direction. In order to increase the light confinement coefficient in the vertical direction, the Al composition of first clad layer 14 and second clad layer 18 needs to be higher than or equal to 0.03.

Accordingly, the Al composition of each of first clad layer 14 and second clad layer 18 is, for example, higher than or equal to 0.03, and the upper limit of the Al composition is, for example, less than or equal to 0.1 and more preferably less than or equal to 0.05.

(1-3 Study on the Number of Well Layers of Active Layer 16)

A quantum well structure including a single or plural well layers is employed as active layer 16 of the light emitting element. In order to obtain laser oscillation with a wavelength of 445 nm, the In composition of the well layer needs to be approximately 0.15. However, the lattice mismatching between InGaN whose In composition is 0.15 and GaN is approximately 1.6%, and thus the thickness of the well layer significantly exceeds the critical thickness of the well layer when the thickness of the well layer is set to be greater than 3 nm, leading to occurrence of lattice defects. The lattice defects become the center of optical absorption, causing an increase in an oscillation threshold current value or in an operation current value of the light emitting element, and leading to a decrease in reliability. It is thus necessary to suppress the occurrence of lattice defects as much as possible. Accordingly, the well layer has a thickness, for example, less than or equal to 3 nm.

In contrast, when the well layer is thin, the light confinement coefficient of the light emitting element in the vertical direction decreases. Accordingly, the number of the well layers needs to be increased. However, when the number of the well layers is four or more, an operation carrier density of each of the well layers is likely to vary, and thus a gain peak wavelength that provides the maximum gain of each of the well layers varies. As a result, the oscillation threshold current value increases. In addition, the number of barrier layers between the well layers also increases, and thus the resistance in series of the light emitting element increases and the effects of a gradient of electric potential of the barrier layers due to a piezoelectric effect increase, leading to an increase in the operation voltage. Thus, when the number of well layers is increased too much, the oscillation threshold current value increases, and the operation voltage of the light emitting element increases. As a result, the temperature properties of the light emitting element are deteriorated.

In contrast, with a well layer including one layer; that is, with a single quantum well structure, the light confinement coefficient decreases and the operation carrier density increases, and thus the carrier overflow increases and an optical output at which thermal saturation occurs in current-optical output properties decreases. Accordingly, even when the well layer is thin having a thickness of 3 nm or less, a double quantum well (DQW) structure in which two layers are included or a triple quantum well (TQW) structure in which three layers are included needs to be employed.

Active layer 16 in the light emitting element according to Embodiment 1 of the present disclosure has the double quantum well structure in which two well layers each including InGaN, having a thickness of 3 nm, and In composition of 0.15 is included, and GaN is included as a barrier layer.

(1-4 Introduction of First Strain Correction Layer 12)

Increasing of the refractive index of the InGaN layer and the AlGaN layer is difficult in the long wavelength range having a wavelength of 445 nm or longer, than in the wavelength range having a center wavelength of 405 nm. Accordingly, it is difficult to increase the light confinement coefficient in the vertical direction. In order to increase the light confinement coefficient in the vertical direction, the Al composition of each of first clad layer 14 and second clad layer 18 needs to be higher than or equal to 0.03. In this case, when the thickness of first clad layer 14 is approximately 1.5 µm, lattice defects or cracking is likely to occur due to a difference in lattice constants between GaN substrate 11 and first clad layer 14.

In order to solve this problem, the light emitting element according to Embodiment 1 of the present disclosure includes first strain correction layer 12 which includes InGaN and has compressive strain, above GaN substrate 11. As a result, it is possible to compensate tensile strain generated in first clad layer 14, making it possible to reduce an average strain of an entire epitaxial layer which is grown in crystal above GaN substrate 11. Accordingly, it is possible to suppress occurrence of cracking or lattice defects.

(1-5 Study on ΔN)

Figure 2:
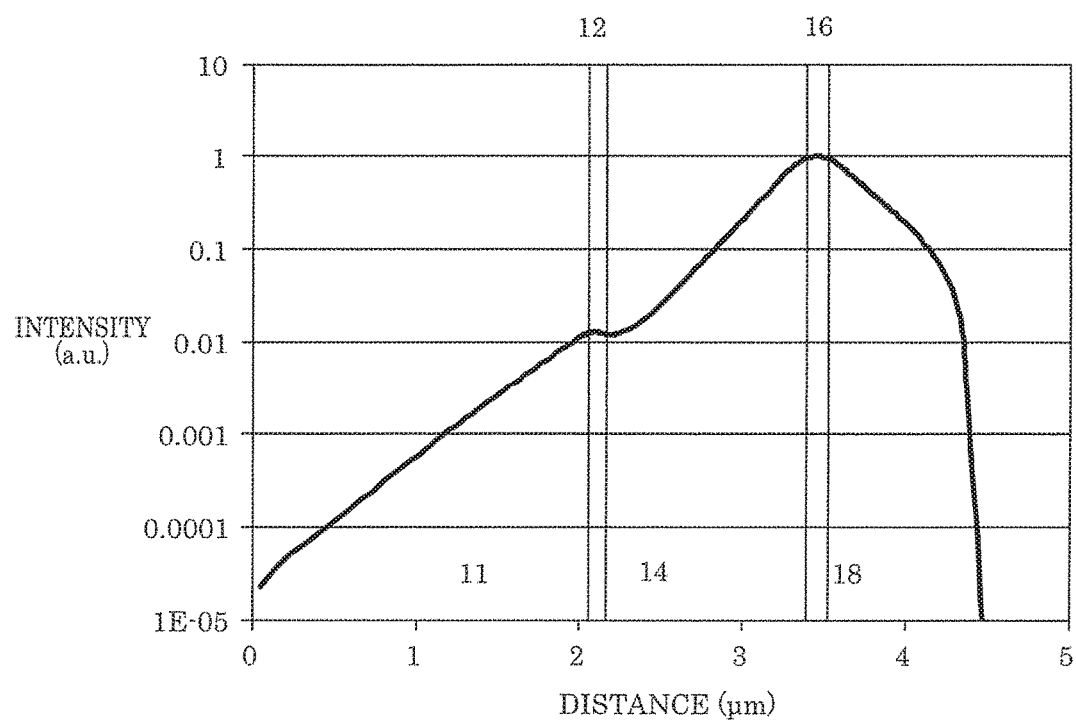
FIG. 2 is a diagram which illustrates light distribution in a direction perpendicular to a main surface of GaN substrate 11 of the light emitting element.

However, a refractive index of first strain correction layer 12 is greater than a refractive index of first clad layer 14, and thus light distribution in the vertical direction is likely to be extended to GaN substrate 11 due to first strain correction layer 12 as illustrated in FIG. 2. As a result, the shape of light distribution inside ridge 18a and the shape of light distribution outside ridge 18a become identical, and a difference in an effective refractive index (ΔN) between inside and outside ridge 18a decreases. When ΔN decreases, the effects of absorption loss which distribution of light guided inside and outside a ridge stripe is subjected to in active layer 16 outside ridge 18a increase, and thus the oscillation threshold value increases. In addition, the highest order in a higher mode of light that can be guided inside and outside the stripe decreases, and the number of modes of guided light decreases. Accordingly, the effects of interference between the modes of the respective orders increase. As a result, kink in which current-optical output properties are non-linear are likely to occur. This results in an increase in the operation current value and a decrease in the temperature properties. In order to prevent this, ΔN which is greater than or equal to $3\times10^{-3}$ is required. It should be noted that, in FIG. 2, the vertical axis indicates logarithms of light intensity (arbitrary unit) when the light intensity in active layer 16 is 1, and the horizontal axis indicates positions of the respective semiconductor layers which are measured along the direction of laminating the semiconductor layers by setting an origin at a point slightly lower of the surface of GaN substrate 11. The numbers in FIG. 2 indicate positions at which the semiconductor layers are present. In the vertical axis in FIG. 2, 1E-05 indicates $1\times10^{-5}$.

In contrast, when ΔN is increased, it is necessary to cause the maximum intensity in a light intensity distribution in the vertical direction inside the ridge to be close to second clad layer 18. In this case, since the P-type impurity concentration is normally increased to be greater than or equal to $1\times10^{-18}$ cm$^{-3}$, waveguide loss increases as being subjected to the effects of the absorption loss of free carrier due to the P-type impurity, the optical output variation (slope efficiency) per unit current in the current-optical output properties decreases, and the temperature properties decrease.

Accordingly, in order to obtain excellent linear current-optical output properties without a decrease in the slope efficiency, ΔN needs to be in a range from $3\times10^{-3}$ to $6\times10^{-3}$.

(1-6 Study on Al Composition of First Low Refractive Index Layer 13)

As described above, ΔN decreases when the thickness of first clad layer 14 decreases due to the effects of first strain correction layer 12. In order to suppress the decrease in ΔN, the light emitting element according to Embodiment 1 of the present disclosure includes first low refractive index layer 13 which has a refractive index less than a refractive index of first clad layer 14.

Figure 3:
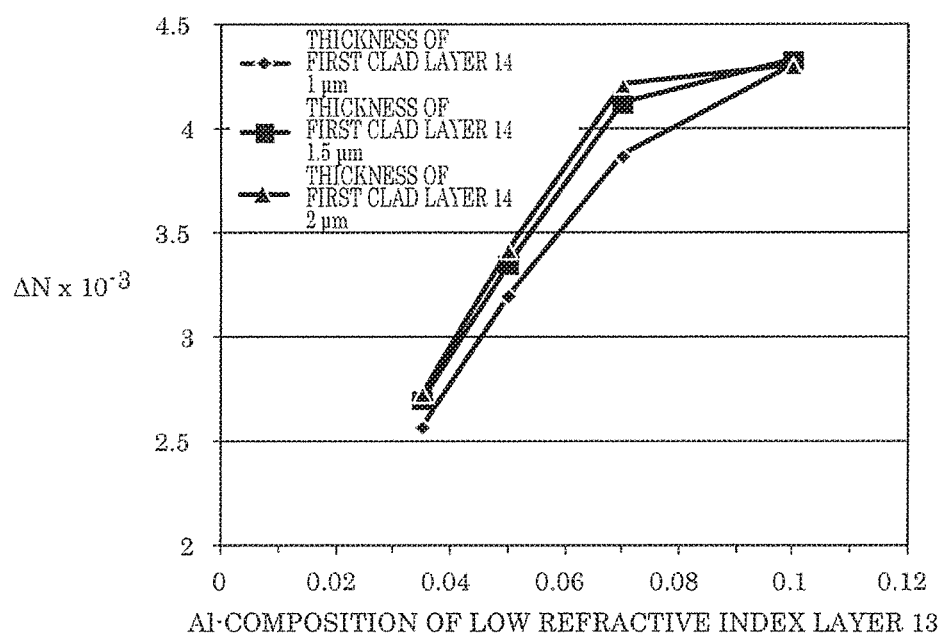
FIG. 3 is a graph which illustrates Al-composition dependency of first low refractive index layer 13 of ΔN, related to the light emitting element.

Here, in order to estimate the effects of first low refractive index layer 13 which has on ΔN, a calculation result of dependency of ΔN on the Al composition of first low refractive index layer 13 in the case where AlGaN having a thickness of 0.1 μm is used in first low refractive index layer 13 is illustrated in FIG. 3. In the calculation, the thickness of first clad layer 14 is set to 1 μm, 1.5 μm, and 2 μm, and the In composition of first strain correction layer 12 is set to 4%.

As illustrated in FIG. 3, the smaller the thickness of first clad layer 14 is, the greater the decrease in ΔN becomes. In particular, the calculation result shows that, to obtain ΔN that is greater than or equal to $3\times10^{-3}$ even when the thickness of first clad layer 14 is 1 μm, it is necessary to employ an AlGaN layer which has the Al composition of higher than or equal to 0.05; that is, the Al composition greater than the Al composition of first clad layer 14 by at least 0.015. Furthermore, the calculation result shows that, to obtain ΔN that is greater than or equal to $3.5\times10^{-3}$, it is necessary to employ an AlGaN layer which has the Al composition of higher than or equal to 0.06; that is, the Al composition greater than the Al composition of first clad layer 14 by at least 0.025.

Figure 4A:
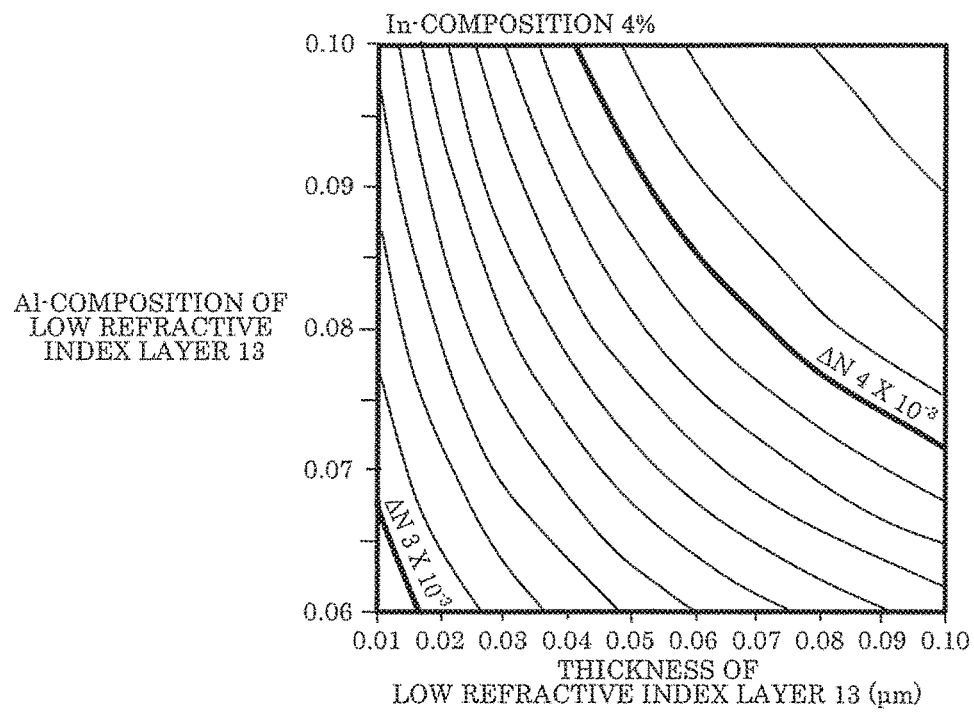
FIG. 4A is a diagram which relates to the light emitting element, and illustrates a composition and layer thickness dependency of first low refractive index layer 13 of ΔN when an In composition of first strain correction layer 12 is 4%.
Figure 4B:
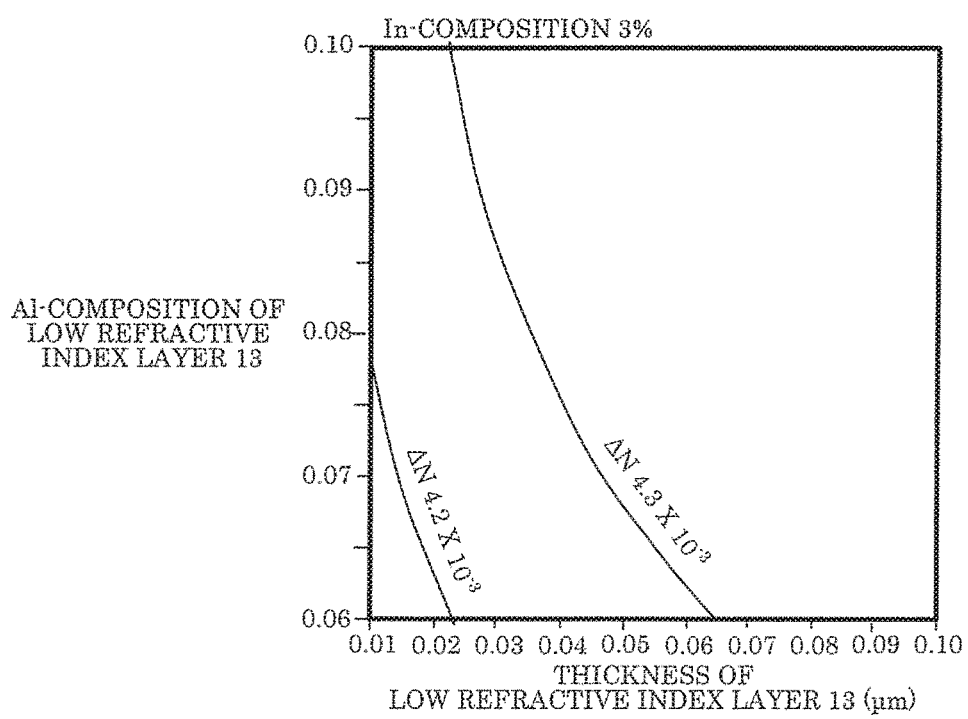
FIG. 4B is a diagram which relates to the light emitting element, and illustrates a composition and layer thickness dependency of first low refractive index layer 13 of ΔN when the In composition of first strain correction layer 12 is 3%.

FIG. 4A and FIG. 4B show calculation results of the dependency of ΔN on the composition and thickness of first low refractive index layer 13, in the case where the In compositions of first strain correction layer are respectively set to 4% and 3%. As shown in FIG. 4B, ΔN is less dependent on the composition and thickness of first low refractive index layer 13 in the case where the In composition of first strain correction layer 12 is 3%. However, ΔN is heavily dependent on the composition and thickness of first low refractive index layer 13 in the case where the In composition of first strain correction layer 12 is 4%. Accordingly, the calculation results show that the In composition of first strain correction layer 12 is set to lower than or equal to 3% in order to prevent ΔN from being affected by first strain correction layer 12. In addition, by setting the Al composition of first low refractive index layer 13 to be in a range from 0.06 to 0.1, and the thickness to be in a range from 10 nm to 100 nm, it is possible to implement ΔN greater than or equal to $4\times10^{-3}$. According to Embodiment 1 of the present disclosure, the In composition of first strain correction layer 12 is set to 0.02, the Al composition of first low refractive index layer 13 is set to 0.06 that is higher than the Al composition of first clad layer 14 by 0.025, and the thickness of first clad layer 14 to be 0.05 μm, thereby making it possible to suppress a decrease of ΔN even when the thickness of first clad layer 14 is 1 μm. It should be noted that, since the refractive index of first low refractive index layer 13 can be decreased as the Al composition of first low refractive index layer 13 is greater, it is possible to increase the light confinement ratio in active layer 16 and increase ΔN. However, since the difference in lattice constant from GaN substrate 11 increases, the crystallinity of first low refractive index layer 13 is deteriorated. For that reason, the Al composition of first low refractive index layer 13 may be lower than or equal to 0.1.

More specifically, first low refractive index layer 13 may be formed using N-type $Al_bGa_{1-b}N$ ($0.06 \leq b \leq 0.1$).

Moreover, from the perspective of ΔN, the thickness of first low refractive index layer 13 may be at least 10 nm and at most 100 nm.

To summarize the above, the structure parameters of the light emitting element according to Embodiment 1 of the present disclosure are indicated in Table 1.

TABLE 1

| Name of Layer | Conductivity Type | Thickness | Material |
|---|---|---|---|
| GaN substrate 11 | N-type | | GaN |
| First strain correction layer 12 | N-type | 0.1 μm | InGaN |
| First low refractive index layer 13 | N-type | 0.05 μm | AlGaN |
| First clad layer 14 | N-type | 1.3 μm | AlGaN |
| Light guide layer 15 | N-type | 0.2 μm | GaN |

TABLE 1-continued

| Name of Layer | Conductivity Type | Thickness | Material |
|---|---|---|---|
| Active layer 16 | | | InGaN/GaN |
| Electron barrier layer 17 | P-type | 20 nm | AlGaN |
| Second clad layer 18 | P-type | 0.7 μm | AlGaN |
| Contact layer 19 | P-type | 0.1 μm | GaN |

It should be noted that, as active layer 16, the double quantum well structure in which the well layer includes $In_{0.15}Ga_{0.85}N$ and has a thickness of 3 nm and the barrier layer includes GaN and has a thickness of 3 nm is employed.

Study has been conducted using the In compositions, the Al compositions, and the thicknesses of first strain correction layer 12, first low refractive index layer 13, first clad layer 14, and second clad layer 18, as parameters.

(1-7 Relationship Between First Strain Correction Layer 12 and Effects of Strain)

The following describes the effects of strain of first strain correction layer 12 which have on each of the layers included in the light emitting element.

Figure 5:
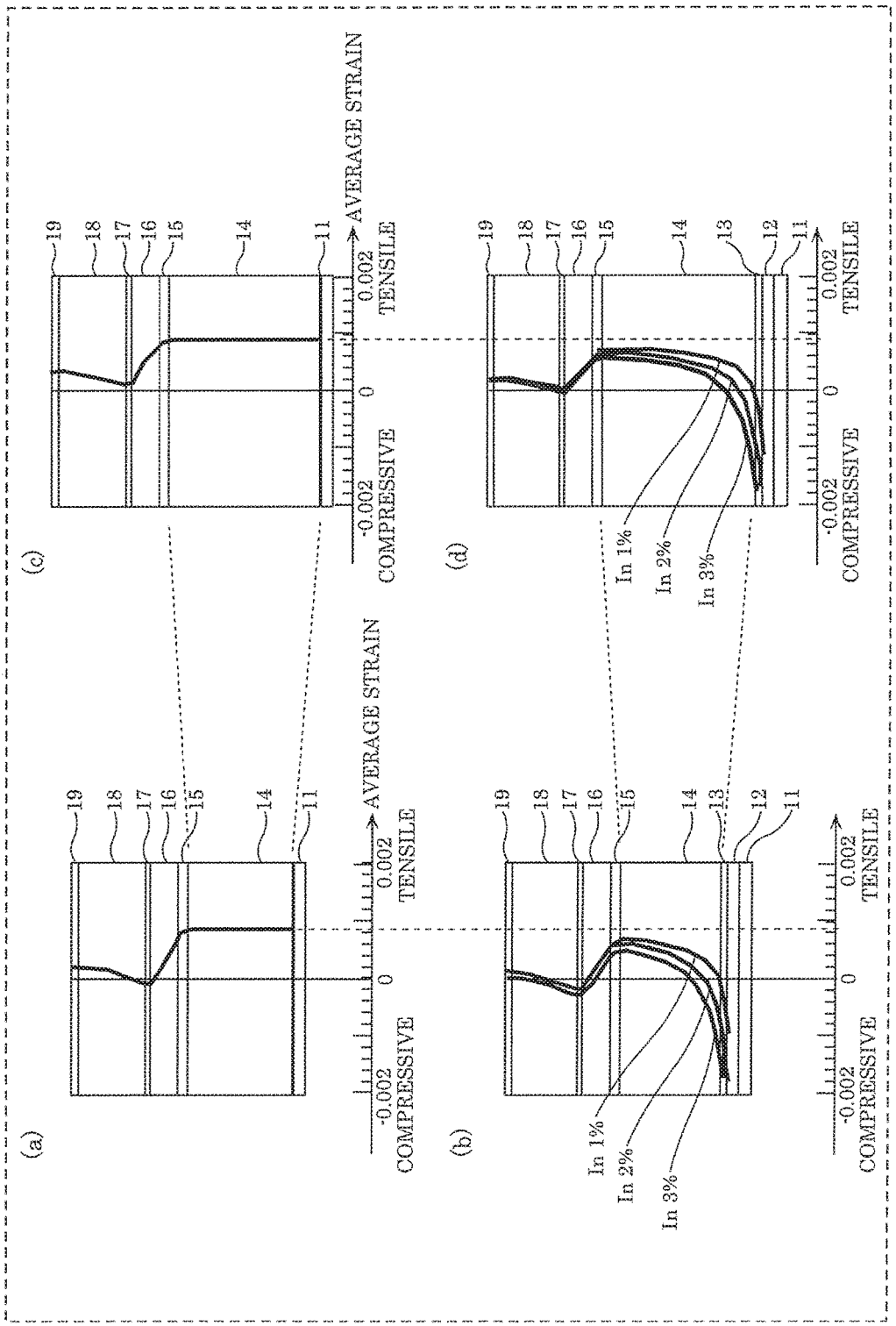
FIG. 5 is a diagram which relates to the light emitting element, and shows a comparison of results of calculating an average strain amount at each point along a laminating direction.
Figure 6:
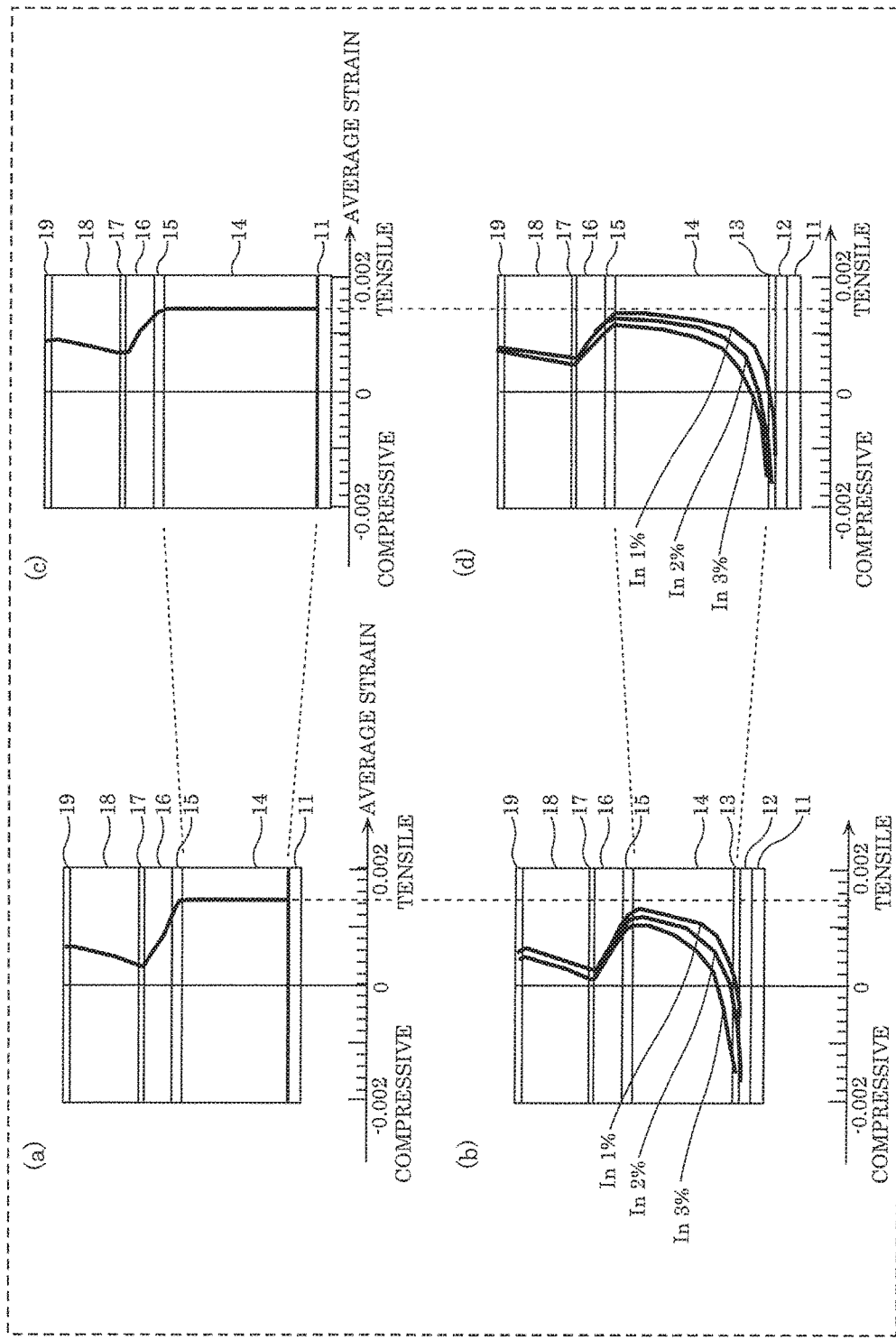
FIG. 6 is a diagram which relates to the light emitting element, and shows a comparison of results of calculating an average strain amount at each point along a laminating direction.

FIG. 5 and FIG. 6 each show a calculation result of an average strain amount at each point along a laminating direction of the light emitting element according to Embodiment 1 of the present disclosure. It should be noted that, in FIG. 5 and FIG. 6, active layer 16 extends in the laminating direction.

Table 2 and Table 3 each indicate parameters of first strain correction layer 12, first low refractive index layer 13, first clad layer 14, and second clad layer 18, which are studied. It should be noted that the parameters of layers other than the layers indicated in Table 2 and Table 3 are the same as those in Table 1.

TABLE 2

| | FIG. 5 (a) | FIG. 5 (b) | FIG. 5 (c) | FIG. 5 (d) |
|---|---|---|---|---|
| Thickness of first strain correction layer 12 | — | 0.1 μm | — | 0.1 μm |
| Al composition of first low refractive index layer 13 | — | 0.06 | — | 0.06 |
| Thickness of first low refractive index layer 13 | — | 0.05 μm | — | 0.05 μm |
| Thickness of first clad layer 14 | 1 μm | 1 μm | 1.5 μm | 1.5 μm |
| Al composition of first clad layer 14 | 0.035 | 0.035 | 0.035 | 0.035 |
| Thickness of second clad layer 18 | 0.7 μm | 0.7 μm | 0.7 μm | 0.7 μm |
| Al composition of second clad layer 18 | 0.035 | 0.035 | 0.035 | 0.035 |

TABLE 3

| | FIG. 6 (a) | FIG. 6 (b) | FIG. 6 (c) | FIG. 6 (d) |
|---|---|---|---|---|
| Thickness of first strain correction layer 12 | — | 0.1 μm | — | 0.1 μm |
| Al composition of first low refractive index layer 13 | — | 0.085 | — | 0.085 |
| Thickness of first low refractive index layer 13 | — | 0.05 μm | — | 0.05 μm |
| Thickness of first clad layer 14 | 1 μm | 1 μm | 1.5 μm | 1.5 μm |
| Al composition of first clad layer 14 | 0.06 | 0.06 | 0.06 | 0.06 |
| Thickness of second clad layer 18 | 0.7 μm | 0.7 μm | 0.7 μm | 0.7 μm |
| Al composition of second clad layer 18 | 0.06 | 0.06 | 0.06 | 0.06 |

FIG. 5 shows in (a) a calculation result of an average strain amount at each point along the laminating direction of the light emitting element according to Embodiment 1 of the present disclosure, when the In composition is varied between 0.01, 0.02, and 0.03, in the case where first strain correction layer 12 and first low refractive index layer 13 are not included, first clad layer 14 has a thickness of 1 μm and the Al composition of 0.035, and second clad layer 18 has a thickness of 0.7 μm and the Al composition of 0.035. An average strain amount (Eequ(Z)) at a point along the laminating direction is an average of strain of layers to a given point Z along the laminating direction of a structure formed above GaN substrate 11, in which a thickness of each of the layers is taken into account, and is calculated by Expression 1.

[Math. 1]

$$E_{equ}(z) = \frac{\int_0^z e(z')\,dz'}{z} \quad \text{Expression 1}$$

Here, e(z′) denotes strain at point z′ in Z-direction (laminating direction). As illustrated in (a) of FIG. 5, in the case where first strain correction layer 12 and first low refractive index layer 13 are not included, tensile strain of approximately 8×10−4 is generated uniformly in first clad layer 14, an average strain amount is compensated and reduced in a region of active layer 16 in which an InGaN material is include and compressive strain is generated, and tensile strain increases again in second clad layer 18 in which tensile strain is generated. The calculation result indicates that relatively large strain is generated in first clad layer 14, and cracking and lattice defects are likely to occur in first clad layer 14, in the case where first strain correction layer 12 and first low refractive index layer 13 are not included.

FIG. 5 shows in (b) a calculation result of an average strain amount at each point along the laminating direction of the light emitting element according to the present disclosure, when the In composition of first strain correction layer 12 is varied between 0.01, 0.02, and 0.03, in the case where first strain correction layer 12 has a thickness of 0.1 μm, first low refractive index layer 13 has the Al composition of 0.06 that is higher by 0.025 than the Al composition of first clad layer 14, first low refractive index layer 13 has a thickness of 0.05 μm, first clad layer 14 has a thickness of 1 μm, and second clad layer 18 has a thickness of 0.7 μm.

FIG. 5 shows in (b) that, by including first strain correction layer 12, the average strain generated in first clad layer 14 is reduced, compared to the light emitting element illustrated in (a) of FIG. 5.

This is because the tensile strain generated in first clad layer 14 is compensated and reduced by the compressive strain generated in first strain correction layer 12. As a result, it is possible to reduce the strain generated in first clad layer 14, by setting the In composition of first strain correction layer 12 in a range from 0.01 to 0.03.

FIG. 5 shows in (c) and (d) calculation results when the thickness of first clad layer 14 is set to 1.5 μm for the light emitting element of (a) and (b) of FIG. 5, respectively. As with the result indicated in (b) of FIG. 5, the tensile strain generated in first clad layer 14 is compensated and reduced by the compressive strain generated in first strain correction layer 12 when the thickness of first clad layer 14 is set to 1.5 μm.

The results indicated in (a) of FIG. 5 to (d) of FIG. 5 show that it is possible to reduce the strain generated in first clad layer 14, by setting the thickness of first clad layer 14 in a range from 1.0 μm to 1.5 μm and the In composition of first strain correction layer 12 in a range from 0.01 to 0.03.

FIG. 6 shows in (a) a calculation result of an average strain amount at each point along the laminating direction of the light emitting element according to the present disclosure, when the In composition is varied between 0.01, 0.02, and 0.03, in the case where first strain correction layer 12 and first low refractive index layer 13 are not included, first clad layer 14 has a thickness of 1 μm and the Al composition of 0.06, and second clad layer 18 has a thickness of 0.7 μm and the Al composition of 0.06.

As illustrated in (a) of FIG. 6, in the case where first strain correction layer 12 and first low refractive index layer 13 are not included, strain of approximately $1.4 \times 10^{-3}$ is generated uniformly in first clad layer 14, an average strain amount is compensated and reduced in a region of active layer 16 in which an InGaN material is included and compressive strain is generated, and tensile strain increases again in second clad layer 18 in which tensile strain is generated. The calculation result indicates that relatively large strain is generated in first clad layer 14, and cracking and lattice defects are likely to occur in first clad layer 14, in the case where first strain correction layer 12 and first low refractive index layer 13 are not included.

FIG. 6 shows in (b) a calculation result of an average strain amount at each point along the laminating direction of the light emitting element according to Embodiment 1 of the present disclosure, when the In composition of first strain correction layer 12 is varied between 0.01, 0.02, and 0.03, in the case where first strain correction layer 12 has a thickness of 0.1 μm, first low refractive index layer 13 has the Al composition of 0.085 that is higher by 0.025 than the Al composition of first clad layer 14, first low refractive index layer 13 has a thickness of 0.05 μm, first clad layer 14 has a thickness of 1 μm, and second clad layer 18 has a thickness of 0.7 μm.

FIG. 6 shows in (b) that, by including first strain correction layer 12, the average strain generated in first clad layer 14 is reduced, compared to the structure illustrated in (a) of FIG. 6.

This is because the tensile strain generated in first clad layer 14 is compensated and reduced by the compressive strain generated in first strain correction layer 12. As a result, it is possible to reduce the strain generated in first clad layer 14, by setting the In composition of first strain correction layer 12 in a range from 0.01 to 0.03.

FIG. 6 shows in each of (c) and (d) that a calculation result when the thickness of first clad layer 14 is set to 1.5 μm for the structure illustrated in (a) and (b) of FIG. 6. As with the result indicated in (b) of FIG. 6, the tensile strain generated in first clad layer 14 is compensated and reduced by the compressive strain generated in first strain correction layer 12 when the thickness of first clad layer 14 is set to 1.5 μm.

The results indicated in (a) of FIG. 6 to (d) of FIG. 6 show that it is possible to reduce the strain generated in first clad layer 14, by setting the thickness of first clad layer 14 in a range from 1.0 μm to 1.5 μm and the In composition of first strain correction layer 12 in a range from 0.01 to 0.03.

The thickness of first strain correction layer 12 is set to 0.1 μm. When the thickness of first strain correction layer 12 is increased, the effect of compensating tensile strain generated in first clad layer 14 increases, and the effect of reducing tensile strain generated in first clad layer 14 increases.

However, when the thickness of first strain correction layer 12 is increased too much, lattice defects occur in first strain correction layer 12 due to a difference in lattice constant from GaN substrate 11, leading to a decrease in crystallinity. In fact, when the thickness of first strain correction layer 12 exceeds 0.3 μm, lattice defects are likely to occur in first strain correction layer 12.

In contrast, when the thickness of first strain correction layer 12 is less than 0.1 μm, the effects of compensating the tensile stress generated in first clad layer 14 and second clad layer 18 are reduced.

For that reason, in order to obtain the effect of reducing tensile strain generated in first clad layer 14 without causing lattice defects to occur in first strain correction layer 12, the thickness of first strain correction layer 12 may be set in a range from 0.1 μm to 0.3 μm inclusive.

(1-8 Study on Strain Generated in Electron Barrier Layer 17 and Second Clad Layer 18)

Heat is generated in a light emitting element during operation of the light emitting element. At this time, a phenomenon called carrier overflow in which an electron injected into active layer 16 is excited by heat, and the electron flows to electron barrier layer 17 and second clad layer 18 is likely to occur.

Here, when compressive strain is added to electron barrier layer 17 and second clad layer 18, band gap energy of each of electron barrier layer 17 and second clad layer 18 increases, and a barrier height of each of barrier layer 17 and second clad layer 18 against electrons increases. The increase in the barrier height against electrons allows reduction in the carrier overflow. For that reason, an oscillation threshold value and an operation current value of a light emitting element during operation are decreased, making it possible to enhance reliability in a long-term operation of the light emitting element.

As shown in (b) of FIG. 5, when the thickness of first strain correction layer 12 is 0.1 μm and the thickness of first clad layer 14 is 1 μm, the average strain amount of the entirety of the layers formed above GaN substrate 11 is approximately 0 due to the effects of first strain correction layer 12. At this time, the compressive strain is generated in electron barrier layer 17 and second clad layer 18. Accordingly, with the light emitting element illustrated in (b) of FIG. 5, it is possible to reduce carrier overflow. As a result, it is possible to enhance the reliability in a long-term operation of the light emitting element.

It should be noted that since first clad layer 14 provides the tensile strain to the entirety of layers, it is possible to cause the average strain of the entirety of layers to be the compressive strain, by setting the thickness of first clad layer 14 to less than or equal to 1 μm for the light emitting element illustrated in (b) of FIG. 5. Accordingly, it is possible to add the compressive strain to electron barrier layer 17 and second clad layer 18.

On the other hand, as illustrated in (b) of FIG. 6, when the Al composition of first clad layer 14 is 0.06, the average strain of the entirety of layers is the tensile strain, and thus the tensile strain is added to electron barrier layer 17 and second clad layer 18. This case is not suitable to reduction of carrier overflow of the light emitting element. Accordingly, in order to add the compressive strain to electron barrier layer 17 and second clad layer 18, as the average strain of the entirety of layers being the tensile strain, the Al composition of first clad layer may be lower than or equal to 0.04.

It should be noted that, as described above, the Al composition of first clad layer 14 and second clad layer 18 may be set to higher than or equal to 0.03 in order to increase a light confinement coefficient in the vertical direction, the Al composition of first clad layer 14 may be at least 0.03 and at most 0.04.

(1-9 Study on a Material of First Low Refractive Index Layer 13)

First low refractive index layer 13 is not limited to the AlGaN material, and may be InGaAlN having a refractive index lower than a refractive index of the AlGaN layer having the Al composition of 0.06.

Figure 7:
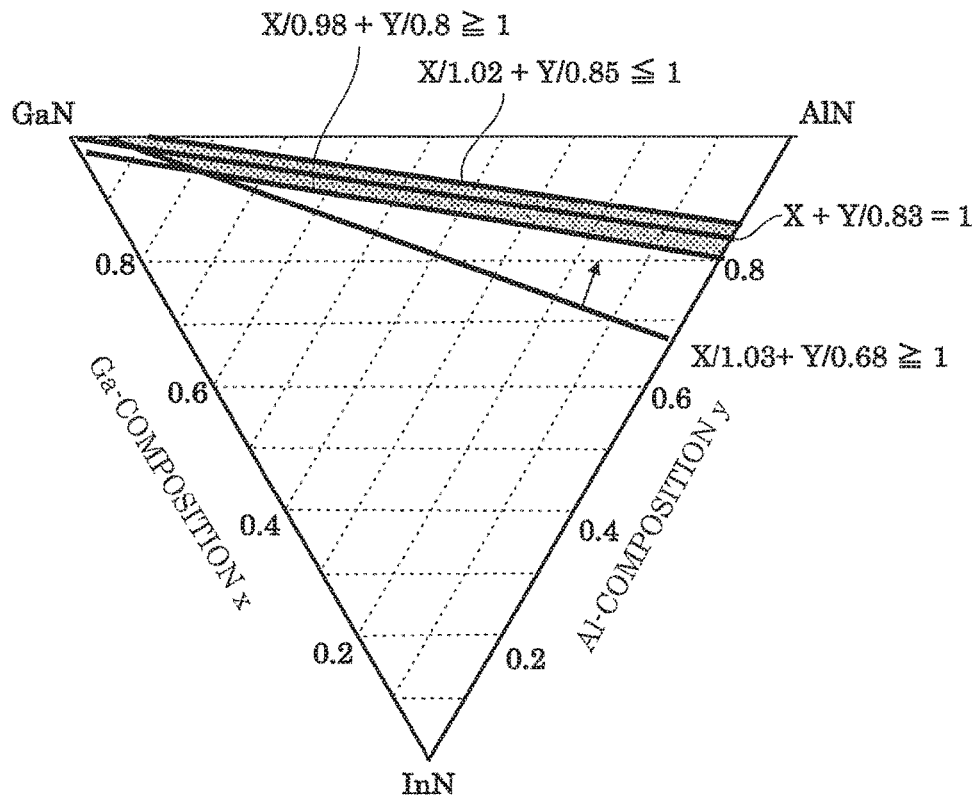
FIG. 7 is a diagram which relates to the light emitting element, and shows an example range of an atomic composition when the first low refractive index layer 13 includes InGaAlN.

FIG. 7 illustrates a composition diagram related to $In_{1-x-y}Al_yGa_xN$ (0≤x≤1, 0≤y≤1). Here, when X=a, and Y=B, the region represented by Math. 2 below in FIG. 7 indicates a region in which the refractive index of $In_{1-a-b}Al_bGa_aN$ is lower than the refractive index of $Al_{0.05}Ga_{0.95}N$.

[Math. 2]

$$(a/1.03)+(b/0.68) \geq 1 \quad \text{Expression 2}$$

Accordingly, when the conditions of Expression 2 are satisfied, it is possible to cause the refractive index of first low refractive index layer 13 to be less than the refractive index of AlGaN having the Al composition of 0.05. In first low refractive index layer 13 in which the conditions are satisfied, it is possible to increase ΔN.

In addition, since $In_{1-a-b}Al_bGa_aN$ which satisfies Math. 3 lattice-matches with GaN, it is possible to cause a difference in lattice constant between first low refractive index layer 13 and GaN substrate 11 to be less than a difference in lattice constant between $Al_{0.1}Ga_{0.9}N$ and GaN substrate 11, by setting a and b in the range indicated by Math. 4 and Math. 5 (i.e., the region hatched in FIG. 7).

[Math. 3]

$$a+(b/0.83)=1 \quad \text{Expression 3}$$

[Math. 4]

$$(a/0.98)+(b/0.8) \geq 1 \quad \text{Expression 4}$$

[Math. 5]

$$(a/1.02)+(b/0.85) \leq 1 \quad \text{Expression 5}$$

For that reason, in first low refractive index layer 13 which satisfies the conditions of Expression 4 and Expression 5, occurrence of lattice defects is suppressed.

For example, it is possible to use $In_{0.02}Al_{0.12}Ga_{0.86}N$ as first low refractive index layer 13. $In_{0.02}Al_{0.12}Ga_{0.86}N$ satisfies Expression 1 and also substantially satisfies Expression 2, and thus is suitable.

In addition, first low refractive index layer 13 may have a single quantum well structure or a multiple quantum well structure, in which, for example, one or more layers of $In_{0.02}Al_{0.12}Ga_{0.86}N$ each having a thickness of 5 nm and two or more $In_{0.04}Al_{0.24}Ga_{0.72}N$ each having a thickness of 3 nm are alternately formed. It should be understood that the thickness of each of the layers included in the single quantum well structure or the multiple quantum well structure is not limited to the above-described example.

In conclusion, the light emitting element according to the present disclosure may have a configuration as described below.

As a light emitting element, GaN substrate 11; first strain correction layer 12 which is disposed above GaN substrate 11 and includes $In_xGa_{1-x}N$ (0<x≤1) of a first conductivity type (N-type); and first low refractive index layer 13 which is disposed above first strain correction layer 12, includes $In_{1-a-b}Ga_aAl_aN$ of the first conductivity type (N-type), and has relationships of (a/0.98)+(b/0.8)≥1, (a/1.02)+(b/0.85)≤1, and (a/1.03)+(b/0.68)≥1 are included. In addition, first clad layer 14 which is disposed above first low refractive index layer 13, includes $Al_zGa_{1-z}N$ (0.03≤z≤0.06) of the first conductivity type, and has a refractive index higher than a refractive index of first low refractive index layer 13, and active layer 16 which is disposed above first clad layer are included.

In addition, second clad layer 18 which is disposed above active layer 16, includes $Al_tGa_{1-t}N$ (0≤t≤1) of a second conductivity type (P-type), and includes ridge 18a protruding in a direction from GaN substrate 11 toward active layer 16 may be included.

Here, first low refractive index layer 13 may have a multi-layer structure in which an $In_{1-a-b}Ga_aAl_bN$ layer whose average atomic composition satisfies the above-described Expression 3 to Expression 5 is included, or may be a layer having a quantum effect with a thinned $In_{1-a-b}Ga_aAl_bN$ layer. In addition, first low refractive index layer 13 may have a single quantum well structure or a multiple quantum well structure including two or more layers.

Embodiment 2

(2-1 Element Structure)

Figure 8:
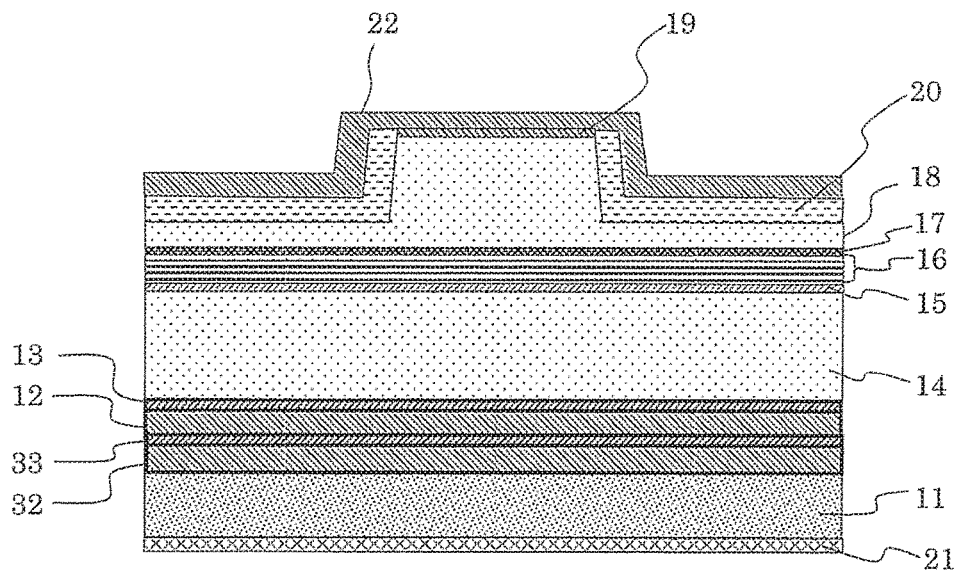
FIG. 8 is a cross sectional view which illustrates a layer structure of the light emitting element according to Embodiment 2 of the present disclosure.

The light emitting element according to Embodiment 2 of the present disclosure includes, as illustrated in FIG. 8, second strain correction layer 32 and intermediate layer 33 between GaN substrate 11 and first strain correction layer 12 of the light emitting element according to Embodiment 1 illustrated in FIG. 1. In this structure, second strain correction layer 32 includes an AlGaN material, and is an AlGaN layer having the Al composition lower than or equal to 0.01. In addition, intermediate layer 33 includes a GaN layer. Intermediate layer 33 is capable of reducing stress generated at an interface of first strain correction layer 12 facing substrate 11 to a greater degree, compared to the case where first strain correction layer 12 is laminated directly on second strain correction layer 32. As a result, it is possible to further suppress occurrence of lattice defects in first strain correction layer 12, compared to the case where first strain correction layer 12 is laminated directly on second strain correction layer 32.

The light emitting element according to Embodiment 2 is the same as the light emitting element according to Embodiment 1 in the structures of each of the semiconductor layers from first strain correction layer 12 to contact layer 19, current block layer 20, N-side electrode 21, and P-side electrode 22. In addition, the light emitting element according to Embodiment 2 is the same as the light emitting element according to Embodiment 1 in the structure of the ridge stripe.

More specifically, the light emitting element according to Embodiment 2 of the present disclosure further includes: in addition to the structural components included in the light emitting element according to Embodiment 1, second strain correction layer 32 which includes $Al_sGa_{1-s}N$ (0<s≤0.01) of the first conductive type (N-type) on the side close to GaN substrate 11 between GaN substrate 11 and first strain correction layer 12; and intermediate layer 33 which includes GaN of the first conductive type (N-type) between second strain correction layer 32 and first strain correction layer 12.

The structure parameters of the light emitting element according to Embodiment 2 of the present disclosure are indicated in Table 4.

TABLE 4

| Name of Layer | Conductivity Type | Thickness | Material |
|---|---|---|---|
| GaN substrate 11 | N-type | | GaN |
| Second strain correction layer 32 | N-type | 1 μm | AlGaN |
| Intermediate layer 33 | N-type | 0.1 μm | GaN |
| First strain correction layer 12 | N-type | 0.1 μm | InGaN |
| First low refractive index layer 13 | N-type | 0.05 μm | AlGaN |
| First clad layer 14 | N-type | 1.3 μm | AlGaN |
| Light guide layer 15 | N-type | 0.2 μm | GaN |
| Active layer 16 | | | InGaN/GaN |
| Electron barrier layer 17 | P-type | 20 nm | AlGaN |
| Second clad layer 18 | P-type | 0.7 μm | AlGaN |
| Contact layer 19 | P-type | 0.1 μm | GaN |

Figure 9:
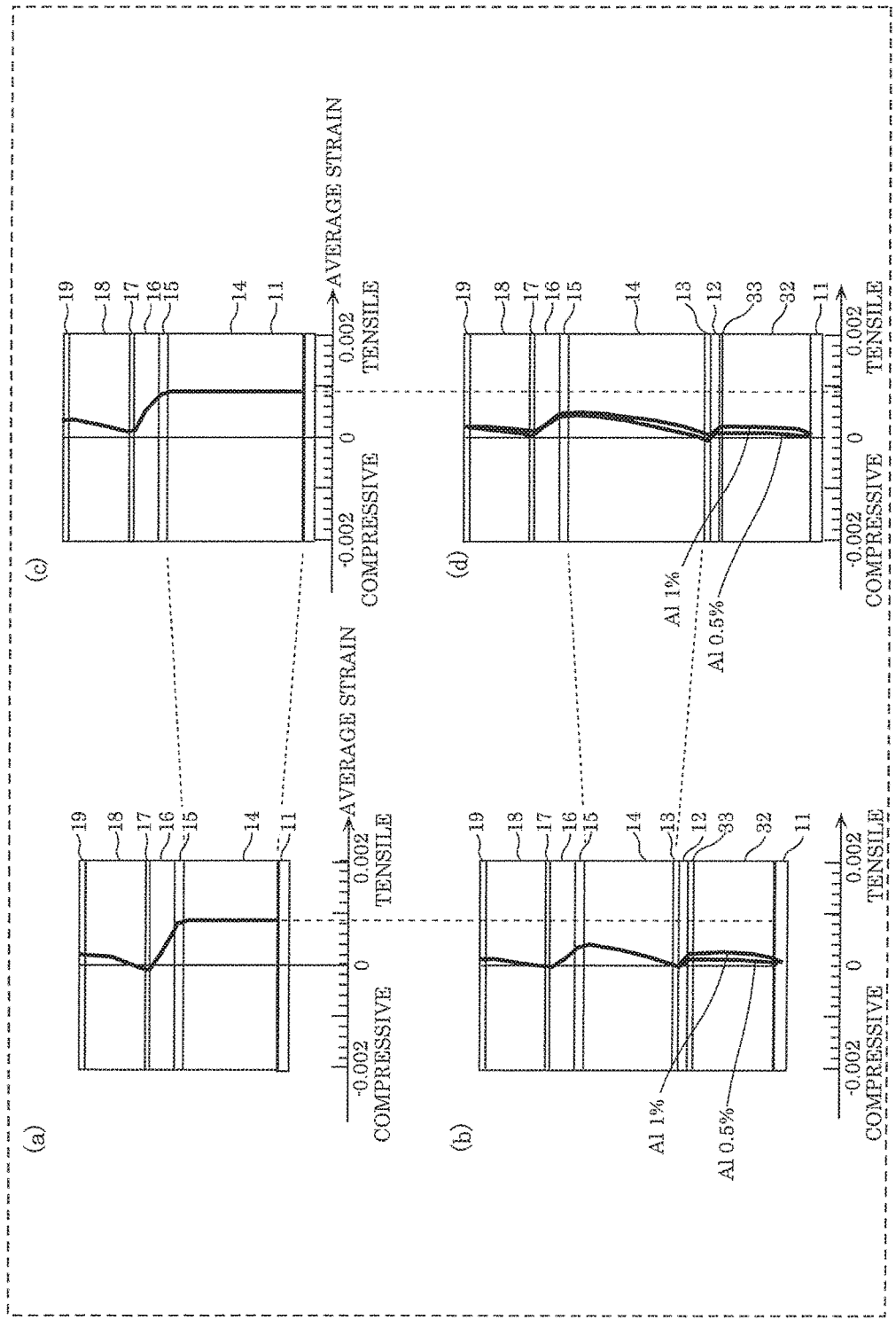
FIG. 9 is a diagram which relates to the light emitting element, and shows a comparison of results of calculating an average strain amount at each point along a laminating direction.
Figure 10:
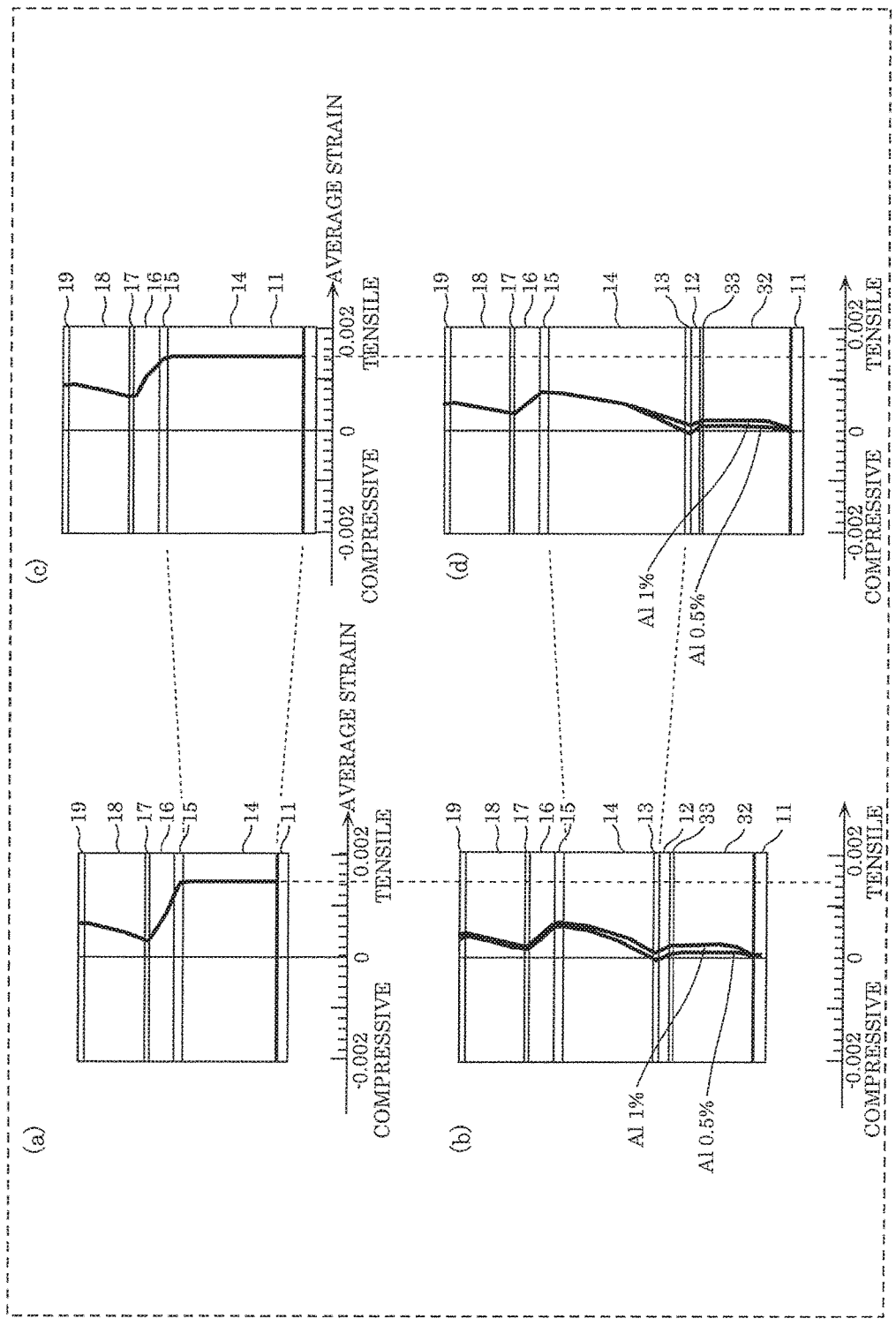
FIG. 10 is a diagram which relates to the light emitting element, and shows a comparison of results of calculating an average strain amount at each point along a laminating direction.
Figure 11:
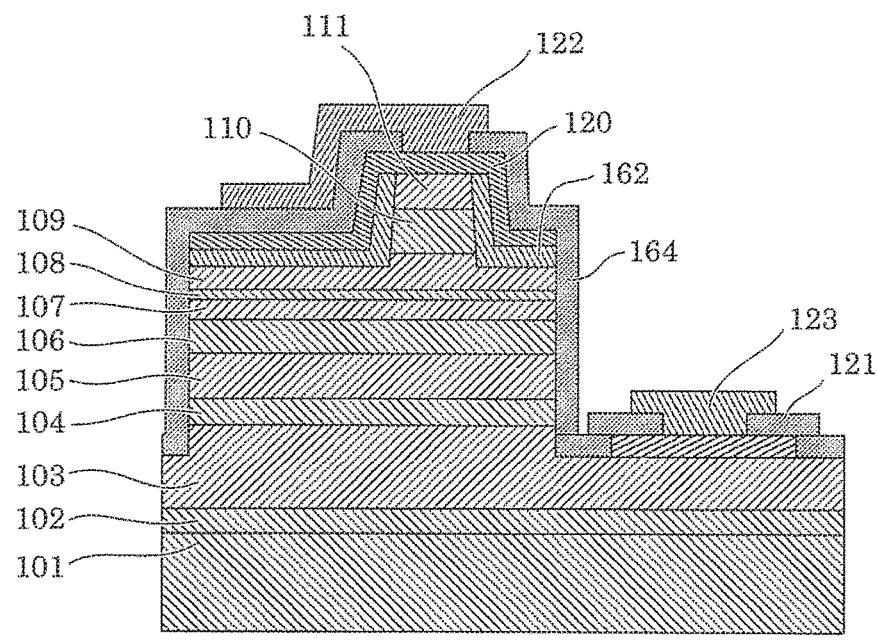
FIG. 11 is a cross sectional view which illustrates a layer structure of a first conventional light emitting element.

FIG. 9 and FIG. 10 each show a comparison result of calculating an average strain amount at each point along the laminating direction of the light emitting element according to Embodiment 2 of the present disclosure. It should be noted that, in FIG. 9 and FIG. 10, active layer 16 expands in the laminating direction. Table 5 and Table 6 each indicate parameters of first strain correction layer 12, first low refractive index layer 13, first clad layer 14, and second clad layer 18, which are studied. It should be noted that the parameters of layers other than the layers indicated in Table 5 and Table 6 are the same as the parameters indicated in Table 4.

The emission wavelength of the light emitting element according to Embodiment 2 of the present disclosure is 445 nm.

TABLE 5

| | FIG. 9 (a) | FIG. 9 (b) | FIG. 9 (c) | FIG. 9 (d) |
|---|---|---|---|---|
| Thickness of first strain correction layer 12 | — | 0.1 μm | — | 0.1 μm |
| Al composition of first low refractive index layer 13 | — | 0.06 | — | 0.06 |
| Thickness of first low refractive index layer 13 | — | 0.05 μm | — | 0.05 μm |
| Thickness of first clad layer 14 | 1 μm | 1 μm | 1.5 μm | 1.5 μm |
| Al composition, of first clad layer 14 | 0.035 | 0.035 | 0.035 | 0.035 |
| Thickness of second clad layer 18 | 0.7 μm | 0.7 μm | 0.7 μm | 0.7 μm |
| Al composition of second clad layer 18 | 0.035 | 0.035 | 0.035 | 0.035 |

TABLE 6

| | FIG. 10 (a) | FIG. 10 (b) | FIG. 10 (c) | FIG. 10 (d) |
|---|---|---|---|---|
| Thickness of first strain correction layer 12 | — | 0.1 μm | — | 0.1 μm |
| Al composition of first low refractive index layer 13 | — | 0.085 | — | 0.085 |
| Thickness of first low refractive index layer 13 | — | 0.05 μm | — | 0.05 μm |
| Thickness of first clad layer 14 | 1 μm | 1 μm | 1.5 μm | 1.5 μm |
| Al composition of first clad layer 14 | 0.06 | 0.06 | 0.06 | 0.06 |
| Thickness of second clad layer 18 | 0.7 μm | 0.7 μm | 0.7 μm | 0.7 μm |
| Al composition of second clad layer 18 | 0.06 | 0.06 | 0.06 | 0.06 |

Study has been conducted using the In compositions, the Al compositions, and the thicknesses of second strain correction layer 32, first low refractive index layer 13, first clad layer 14, and second clad layer 18 as parameters.

(2-2 Relationship Between First Strain Correction Layer 12 and Effects of Strain)

FIG. 9 shows in (a) a calculation result of an average strain amount at each point along the laminating direction of the light emitting element according to Embodiment 2 of the present disclosure illustrated in FIG. 8, when first clad layer 14 has a thickness of 1 μm and the Al composition of 0.035, and second clad layer 18 has a thickness of 0.7 μm and the Al composition of 0.035, in the case where second strain correction layer 32, intermediate layer 33, first strain correction layer 12, and first low refractive index layer 13 are not included.

As illustrated in (a) of FIG. 9, in the case where second strain correction layer 32, intermediate layer 33, first strain correction layer 12, and first low refractive index layer 13 are not included, tensile strain of approximately $8 \times 10^{-4}$ is generated in first clad layer 14, an average strain amount is compensated and reduced in a region of active layer 16 in which an InGaN material is included and compressive strain is generated, and tensile strain increases again in second clad layer 18 in which tensile strain is generated. The calculation result indicates that relatively large strain is generated in first clad layer 14, and cracking and lattice defects are likely to occur in first clad layer 14, in the case where first strain correction layer 12 and first low refractive index layer 13 are not included.

FIG. 9 shows in (b) a calculation result of an average strain amount at each point along the laminating direction of the light emitting element according to Embodiment 2, when the In composition of first strain correction layer 12 is set to 0.02, in the case where second strain correction layer 32 has a thickness of 0.1 μm and the Al composition of 0.01 and 0.005, intermediate layer 33 has a thickness of 0.1 μm, first strain correction layer 12 has a thickness of 0.1 μm, first low refractive index layer 13 has a thickness of 0.05 μm and the Al composition of 0.06 that is higher by 0.025 than the Al composition of first clad layer 14, first clad layer 14 has a thickness of 1 μm, and second clad layer 18 has a thickness of 0.7 μm.

As illustrated in (b) of FIG. 9, the average strain generated in first clad layer 14 is further reduced, compared to the light emitting element illustrated in (b) of FIG. 5, in any of the cases where the Al composition of second strain correction layer 32 is 0.005 or 0.01.

More specifically, in the light emitting element illustrated in (b) of FIG. 9, the strain of the entirety of the layers is $4 \times 10^{-4}$ at most, which amounts to approximately one-fifth of the amount of the strain of the light emitting element illustrated in (b) of FIG. 5. In particular, strain is approximately 0 in first strain correction layer 12 and first low refractive index layer 13. This shows that it is possible to suppress occurrence of lattice defects in first strain correction layer 12 and first low refractive index layer 13 in the light emitting element illustrated in (b) of FIG. 9.

In addition, the amount of the tensile strain in first clad layer 14 in the light emitting element illustrated in (b) of FIG. 9 is less than the amount of the tensile strain in first clad layer 14 in the light emitting element illustrated in (b) of FIG. 5.

This is because the average strains of the compressive strain in first strain correction layer 12 and the tensile strain in first clad layer 14 are reduced by using second strain correction layer 32 having weak tensile strain.

This shows that it is possible to suppress occurrence of lattice defects in first strain correction layer 12, first low refractive index layer 13, and first clad layer 14 in the light emitting element illustrated in (b) of FIG. 9.

FIG. 9 shows in (c) and (d) that calculation results when the thickness of first clad layer 14 is set to 1.5 µm for the structures illustrated in (a) and (b) of FIG. 9, respectively. The calculation results show that, even when the thickness of first clad layer 14 is set to 1.5 µm, the average strains of the compressive strain in first strain correction layer 12 and the tensile strain in first clad layer 14 are reduced by using second strain correction layer 32 having weak tensile strain, as with the result illustrated in (b) of FIG. 9.

The thickness of first strain correction layer 12 is set to 0.1 µm in the structure illustrated in (b) and (d) of FIG. 9. When the thickness of first strain correction layer 12 is increased, the effect of compensating the tensile strain generated in first clad layer 14 increases, and the effect of reducing the tensile strain generated in first clad layer 14 increases.

However, when the thickness of first strain correction layer 12 is increased too much, lattice defects occur in first strain correction layer 12 due to a difference in lattice constant from GaN substrate 11, leading to a decrease in crystallinity. For that reason, in order to obtain the effect of reducing tensile strain generated in first clad layer 14 without causing lattice defects to occur in first strain correction layer 12, the thickness of first strain correction layer 12 may be set in a range from 0.1 µm to 0.3 µm.

(2-3 Study on Strain Generated in Electron Barrier Layer 17 and Second Clad Layer 18)

As shown in (b) of FIG. 9, when the thickness of first strain correction layer 12 is 0.1 µm and the thickness of first clad layer 14 is 1 µm, the average strain amount of the entirety of the layers formed above GaN substrate 11 is approximately 0 due to the effects of first strain correction layer 12. At this time, the compressive strain is added in electron barrier layer 17. Accordingly, with the light emitting element illustrated in (b) of FIG. 9, it is possible to reduce carrier overflow. As a result, it is possible to enhance the reliability in a long-term operation of the light emitting element.

It should be noted that since first clad layer 14 provides the tensile strain to the entirety of the layers, it is possible to cause the average strain of the entirety of the layers to be the compressive strain, by setting the thickness of first clad layer 14 to less than or equal to 1 µm in the light emitting element illustrated in (b) of FIG. 9. Accordingly, it is possible to add the compressive strain to electron barrier layer 17 and second clad layer 18.

On the other hand, as illustrated in (b) of FIG. 10, when the Al composition of first clad layer 14 is 0.06, the average strain of the entirety of the layers is the tensile strain, and thus the tensile strain is generated in electron barrier layer 17 and second clad layer 18. This case is not suitable to reduction of carrier overflow of the light emitting element. Accordingly, in order to add the compressive strain to electron barrier layer 17 and second clad layer 18, as the average strain of the entirety of layers being the tensile strain, the Al composition of first clad layer may be lower than or equal to 0.04.

(2-4 Study on Strain Generated in First Clad Layer 14)

FIG. 10 illustrates in (a) a calculation result of an average strain amount at each point along the laminating direction of the light emitting element according to Embodiment 2 of the present disclosure illustrated in FIG. 8, when first clad layer 14 has a thickness of 1 µm and the Al composition of 0.06, and second clad layer 18 has a thickness of 0.7 µm and the Al composition of 0.06, in the case where second strain correction layer 32, intermediate layer 33, first strain correction layer 12, and first low refractive index layer 13 are not included.

FIG. 10 shows in (a) that, when second strain correction layer 32, intermediate layer 33, first strain correction layer 12, and first low refractive index layer 13 are not included, tensile strain of approximately $1.4 \times 10^{-3}$ is generated uniformly in N-type first clad layer 14, the average strain amount is compensated and reduced in a region of active layer 16 in which an InGaN material is included and compressive strain is generated, and tensile strain again increases in second clad layer 18 in which tensile strain is generated. The calculation result indicates that relatively large strain is generated in first clad layer 14, and cracking and lattice defects are likely to occur in first clad layer 14, in the case where first strain correction layer 12 and first low refractive index layer 13 are not included.

FIG. 10 indicates in (b) a calculation result of an average strain amount at each point along the laminating direction of the light emitting element according to Embodiment 2 of the present disclosure, when the In composition of first strain correction layer 12 is varied between 0.01, 0.02, and 0.03, in the case where second strain correction layer 32 has a thickness of 1.0 µm and the Al composition of 0.01 and 0.005, intermediate layer 33 has a thickness of 0.1 µm, first strain correction layer 12 has a thickness of 0.1 µm, first low refractive index layer 13 has the Al composition of 0.085 that is higher by 0.025 than the Al composition of first clad layer 14, first low refractive index layer 13 has a thickness of 0.05 µm, first clad layer 14 has a thickness of 1 µm, and second clad layer 18 has a thickness of 0.7 µm.

As illustrated in (b) of FIG. 10, the average strain generated in first clad layer 14 is further reduced, compared to the structure illustrated in (b) of FIG. 6, in any of the cases where the Al composition of second strain correction layer 32 is 0.005 or 0.01.

This is because the average strains of the compressive strain in first strain correction layer 12 and the tensile strain in first clad layer 14 are reduced by using second strain correction layer 32 having weak tensile strain.

FIG. 10 shows in (c) and (d) that calculation results when the thickness of first clad layer 14 is set to 1.5 µm for the structures illustrated in (a) and (b) of FIG. 10, respectively. The calculation results show that, even when the thickness of first clad layer 14 is set to 1.5 µm, the average strains of the compressive strain in first strain correction layer 12 and the tensile strain in first clad layer 14 are reduced by using second strain correction layer 32 having weak tensile strain, as with the result illustrated in (b) of FIG. 10.

The results of (a) to (d) of FIG. 9 and the results of (a) to (d) of FIG. 10 show that it is possible to reduce the strain generated in first clad layer 14, by setting the Al composition of second strain correction layer 32 in a range from 0.005 to 0.01 with the Al compositions of first clad layer 14 and second clad layer 18 being in a range from 0.035 to 0.06, and the thickness of first clad layer 14 being in a range from 1.0 μm to 1.5 μm.

It should be noted that, in the above-described Embodiment 1 and Embodiment 2, the In composition and the thickness of each of the well layers in active layer 16 are not limited to the above-described examples, and the composition and the thickness of the barrier layer are not limited to the above-described examples. It is possible to arbitrarily select an In composition and a thickness for each of the well layers, and a composition and a thickness for the barrier layer, in active layer 16, according to an emission wavelength of the light emitting element.

In particular, by setting the In composition of the well layer to be greater than 0.15, it is possible to cause an emission wavelength to be greater than 445 nm, making it possible to obtain blue or green light emission. For example, it is possible to obtain an emission wavelength of 530 nm by using $In_{0.3}Ga_{0.7}N$ in the well layer.

In addition, although the Al composition of first clad layer 14 and the Al composition of second clad layer 18 are equivalent in the above-described Embodiment 1 and Embodiment 2, the Al compositions need not be equivalent, and the Al composition of first clad layer 14 and the Al composition of second clad layer 18 may be different from each other.

Furthermore, although the layer structure of the light emitting element is formed above the c-surface of GaN substrate 11 in the above-described Embodiment 1 and Embodiment 2, the layer structure need not be formed above the c-surface, and the layer structure of the light emitting element may be formed above a surface more inclined than the c-surface; that is, an off substrate of GaN, or the layer structure of the light emitting element may be formed above a GaN substrate having an m-surface, an r-surface, or an a-surface as a main surface.

The semiconductor laser element has been described in the above-described Embodiment 1 and Embodiment 2. However, the technique according to the present disclosure is also applicable to an LED element, making it possible to implement an LED element having a wavelength region of blue light or a wavelength region longer than blue light with cracking or lattice defects being suppressed.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

According to the present disclosure, it is possible to implement a watt-class light source which is capable of performing an ultrahigh-power operation of greater than or equal to 1 watt, excels in the temperature properties, and ensures long-term reliability, in a light emitting element having a center wavelength of greater than or equal to 445 nm. In particular, it is possible to apply the present disclosure to a watt-class light source used as a projector light source. Moreover, it is possible to apply the present disclosure to not only the projector light source but also, for example, a light source for a vehicle head lamp or a illumination light source used in a sports stadium.

What is claimed is:

1. A light emitting element, comprising:
   a GaN substrate;
   a first strain correction layer disposed above the GaN substrate and including $In_xGa_{1-x}N$ of a first conductivity type where x is greater than 0 and less than or equal to 1;
   a first low refractive index layer disposed above the first strain correction layer, including $In_{1-a-b}Ga_aAl_bN$ of the first conductivity type, and having relationships of $(a/0.98)+(b/0.8) \geq 1$, $(a/1.02)+(b/0.85) \leq 1$, and $(a/1.03)+(b/0.68) \geq 1$;

a first clad layer disposed above the first low refractive index layer, including $Al_zGa_{1-z}N$ of the first conductivity type where z is greater than or equal to 0.03 and less than or equal to 0.06, and having a refractive index higher than a refractive index of the first low refractive index layer; and
   an active layer disposed above the first clad layer.

2. The light emitting element according to claim 1, further comprising:
   a second clad layer disposed above the active layer, including $Al_tGa_{1-t}N$ of a second conductivity type where t is greater than or equal to 0 and less than or equal to 1, and including a ridge protruding in a direction from the GaN substrate toward the active layer.

3. The light emitting element according to claim 2, further comprising:
   an electron barrier layer disposed between the active layer and the second clad layer, and including $Al_hGa_{1-h}N$ of the second conductivity type where h is greater than 0 and less than or equal to 1.

4. The light emitting element according to claim 3,
   wherein an average strain of an entirety of layers disposed between an upper surface of the GaN substrate and an upper surface of the electron barrier layer is compressive.

5. The light emitting element according to claim 3,
   wherein an average strain of an entirety of layers disposed between an upper surface of the GaN substrate and an upper surface of the second clad layer is compressive.

6. The light emitting element according to claim 1,
   wherein x in an In composition of the first strain correction layer is higher than or equal to 0.01 and lower than or equal to 0.03.

7. The light emitting element according to claim 1,
   wherein the first strain correction layer has a thickness greater than or equal to 0.1 μm and less than or equal to 0.3 μm.

8. The light emitting element according to claim 1,
   wherein the first low refractive index layer includes $Al_bGa_{1-b}N$ of the first conductivity type where b is greater than or equal to 0.06 and less than or equal to 0.1.

9. The light emitting element according to claim 1,
   wherein the first low refractive index layer has a thickness greater than or equal to 10 nm and less than or equal to 100 nm.

10. The light emitting element according to claim 1, wherein the first low refractive index layer is a multiple quantum well and has an average atomic composition of $In_{1-a-b}Ga_aAl_bN$.

11. The light emitting element according to claim 1, wherein in the first clad layer, z is less than or equal to 0.04.

12. The light emitting element according to claim 11, wherein the first clad layer has a thickness less than or equal to 1 µm, and z is greater than or equal to 0.03 and less than or equal to 0.04.

13. The light emitting element according to claim 1, further comprising:
    a second strain correction layer disposed between the GaN substrate and the first strain correction layer, and including $Al_sGa_{1-s}N$ of the first conductivity type where s is greater than 0 and less than or equal to 0.01.

14. The light emitting element according to claim 13, further comprising:
    an intermediate layer disposed between the second strain correction layer and the first strain correction layer, and including GaN of the first conductivity type.

15. The light emitting element according to claim 1, wherein the active layer is a quantum well including at least one of: a well layer including $In_fGa_{1-f}N$ where f is greater than 0 and less than or equal to 1; and a barrier layer including $Al_gGa_{1-g}N$ where g is greater than or equal to 0 and less than or equal to 1.

16. The light emitting element according to claim 15, wherein the active layer is a multiple quantum well including at least two well layers each being the well layer.

17. The light emitting element according to claim 16, wherein the active layer is one of a double quantum well and a triple quantum well.

18. The light emitting element according to claim 15, wherein the active layer has a characteristic wavelength greater than or equal to 445 nm.

* * * * *